United States Patent [19]
Okazaki et al.

[11] Patent Number: 5,818,367
[45] Date of Patent: Oct. 6, 1998

[54] SIGNAL MODULATING METHOD, SIGNAL MODULATING APPARATUS, SIGNAL DEMODULATING METHOD AND SIGNAL DEMODULATING APPARATUS

[75] Inventors: Toru Okazaki; Shunji Yoshimura, both of Tokyo, Japan

[73] Assignee: Sony Corporation, Tokyo, Japan

[21] Appl. No.: 612,952

[22] PCT Filed: Jul. 7, 1995

[86] PCT No.: PCT/JP95/01364

§ 371 Date: Mar. 8, 1996

§ 102(e) Date: Mar. 8, 1996

[87] PCT Pub. No.: WO96/02054

PCT Pub. Date: Jan. 25, 1996

[30] Foreign Application Priority Data

Jul. 8, 1994 [JP] Japan ................................ 6-157175

[51] Int. Cl.[6] ............................................... H03M 7/42
[52] U.S. Cl. ............................................................. 341/106
[58] Field of Search .................................... 341/58, 59, 102, 341/106

[56] References Cited

U.S. PATENT DOCUMENTS

| | | | |
|---|---|---|---|
| 5,196,848 | 3/1993 | Sakazaki et al. ......................... | 341/58 |
| 5,341,134 | 8/1994 | Benjauthrit ................................ | 341/58 |
| 5,355,133 | 10/1994 | Shimpuku et al. ....................... | 341/58 |
| 5,365,232 | 11/1994 | Ido et al. ................................... | 341/95 |
| 5,371,771 | 12/1994 | Kim ........................................... | 377/39 |
| 5,469,162 | 11/1995 | Chaki et al. .............................. | 341/58 |
| 5,570,248 | 10/1996 | Ido et al. ................................... | 360/77.14 |

FOREIGN PATENT DOCUMENTS

| | | |
|---|---|---|
| 0 193 153 A2 | 9/1986 | European Pat. Off. . |
| 0 493 044 A2 | 7/1992 | European Pat. Off. . |
| 0 506 446 A1 | 9/1992 | European Pat. Off. . |
| 5-258474 | 10/1993 | Japan . |
| 6-284015 | 10/1994 | Japan . |
| 6-311042 | 11/1994 | Japan . |
| 94-311042 | 11/1994 | Japan . |

OTHER PUBLICATIONS

E-mail transmission received by inventors dated Feb. 24, 1994, not published.

*Primary Examiner*—Brian K. Young
*Attorney, Agent, or Firm*—Hill & Simpson

[57] ABSTRACT

In the present invention, a partly duplexed conversion table is used as a conversion table for converting an M-bit based data string directly into an N-bit based code string without using margin bits. This conversion table is constituted by first and second sub-tables including plural code groups, respectively. The plural code groups include different codes for the same input data. The second sub-table is a table which is partly duplexed with the first sub-table and is produced by allocating different codes to data from first input data to second input data in the first sub-table. The first and second sub-tables are so designed that code sets of the duplexed portions take variants of digital sum variations which are opposite in sign. Codes are allocated to all the code groups in the duplexed portions of the first and second sub-tables with respect to input data sequentially from a code having a maximum absolute value of variant of the digital sum variation. Thus, according to the present invention, low frequency components of modulated signals may be restricted properly.

79 Claims, 20 Drawing Sheets

FIG.4A

| DATA | T1a  state = 1 | | | T2a  state = 2 | | | T3a  state = 3 | | | T4a  state = 4 | | |
|---|---|---|---|---|---|---|---|---|---|---|---|---|
| | Code Word | NS | GP | Code Word | NS | GP | Code Word | NS | GP | Code Word | NS | GP |
| 0  | 0010000000001001 | 1 | D① | 0100000100100000 | 2 | C② | 0010000000001001 | 1 | D① | 0100000100100000 | 2 | C② |
| 1  | 0010000000010010 | 1 | B① | 0010000000010010 | 1 | B① | 1000000100100000 | 3 | E② | 1000000100100000 | 3 | E② |
| 2  | 0010000100100000 | 2 | B② | 0010000100100000 | 2 | B② | 1000000000010010 | 1 | E① | 1000000000010010 | 1 | E① |
| 3  | 0010000001001000 | 2 | D② | 0100010010000000 | 4 | C③ | 0010000001001000 | 2 | D② | 0100010010000000 | 4 | C③ |
| 4  | 0010000010010000 | 2 | B② | 0010000010010000 | 2 | B② | 1000000100100000 | 2 | E② | 1000000100100000 | 2 | E② |
| 5  | 0010000000100100 | 2 | B② | 0010000000100100 | 2 | B② | 1001001000000000 | 4 | E③ | 1001001000000000 | 4 | E③ |
| 6  | 0010000000100100 | 3 | B② | 0010000000100100 | 3 | B② | 1000100100000000 | 4 | E③ | 1000100100000000 | 4 | E③ |
| 7  | 0010000001001000 | 3 | D② | 0100000000010010 | 1 | C① | 0010000001001000 | 3 | D② | 0100000000010010 | 1 | C① |
| 8  | 0010000010010000 | 3 | B② | 0010000010010000 | 3 | B② | 1000010010000000 | 4 | E③ | 1000010010000000 | 4 | E③ |
| 9  | 0010000100100000 | 3 | B② | 0010000100100000 | 3 | B② | 1001001000000001 | 1 | E① | 1001001000000001 | 1 | E① |
| 10 | 0010010010000000 | 4 | B③ | 0010010010000000 | 4 | B③ | 1000100100000001 | 1 | E① | 1000100100000001 | 1 | E① |
| 11 | 0010001001000000 | 4 | B③ | 0010001001000000 | 4 | B③ | 1000000010010000 | 3 | E② | 1000000010010000 | 3 | E② |
| 12 | 0010010010000001 | 1 | B① | 0010010010000001 | 1 | B① | 1000000010010000 | 2 | E② | 1000000010010001 | 2 | E② |
| 13 | 0010001001000001 | 1 | B① | 0010001001000001 | 1 | B① | 1000010010000001 | 1 | E① | 1000010010000000 | 1 | E① |
| 14 | 0010000001001001 | 1 | D① | 0100000000100100 | 3 | C③ | 0010000001001001 | 1 | D① | 0100000000100100 | 3 | C② |
| 15 | 0010000100100001 | 1 | B① | 0010000100100001 | 1 | B① | 1000001001000001 | 1 | E① | 1000001001000001 | 1 | E① |
| 16 | 0010000010010001 | 1 | B① | 0010000010010001 | 1 | B① | 1000000100100001 | 1 | E① | 1000000100100001 | 1 | E① |
| 17 | 0010000000100010 | 1 | B① | 0010000000100010 | 1 | B① | 1000001001000000 | 4 | E③ | 1000001001000000 | 4 | E③ |
| 18 | 0001000000001001 | 1 | D① | 0100000100010000 | 2 | C② | 0001000000001001 | 1 | D① | 0100000100010000 | 2 | C② |
| 19 | 0010000000010001 | 1 | B① | 0010000000010001 | 1 | B① | 1001000100000000 | 4 | E③ | 1001000100000000 | 4 | E③ |
| 20 | 0001000000010010 | 1 | B① | 0001000000010010 | 1 | B① | 1000100010000000 | 4 | E③ | 1000100010000000 | 4 | E③ |
| 21 | 0000100000000010 | 1 | B① | 0000100000000010 | 1 | B① | 1000000010010001 | 1 | E① | 1000000010010001 | 1 | E① |
| 22 | 0000010000000001 | 1 | B① | 0000010000000001 | 1 | B① | 1000000001001001 | 1 | E① | 1000000001001001 | 1 | E① |
| 23 | 0010001000100000 | 2 | B② | 0010001000100000 | 2 | B② | 1000000001001000 | 2 | E② | 1000000001001000 | 2 | E② |
| 24 | 0010000100010000 | 2 | B② | 0010000100010000 | 2 | B② | 1000000001001000 | 3 | E② | 1000000001001000 | 3 | E② |
| 25 | 0010000010001000 | 2 | D② | 0100000000100100 | 2 | C② | 0010000010001000 | 2 | D② | 0100000000100100 | 2 | C② |
| 26 | 0010000001000100 | 2 | B② | 0010000001000100 | 2 | B② | 1000000000100010 | 1 | E① | 1000000000100010 | 1 | E① |
| 27 | 0001000100100000 | 2 | B② | 0001000100100000 | 2 | B② | 1000000000010001 | 1 | E① | 1000000000010001 | 1 | E① |
| 28 | 0010000000001000 | 2 | D② | 0100000100010000 | 3 | C② | 0010000000001000 | 2 | D② | 0100000100010000 | 3 | C② |
| 29 | 0001000100010000 | 2 | B② | 0001000100010000 | 2 | B② | 1001001000000010 | 1 | E① | 1001001000000010 | 1 | E① |
| 30 | 0001000001001000 | 2 | D② | 0100000100100000 | 3 | C② | 0001000001001000 | 2 | D② | 0100000100100000 | 3 | C② |
| 31 | 0001000000100100 | 2 | B② | 0001000000100100 | 2 | B② | 1001000100000001 | 1 | E① | 1001000100000001 | 1 | E① |
| 32 | 0001000000000100 | 2 | B② | 0001000000000100 | 2 | B② | 1000100100000010 | 1 | E① | 1000100100000010 | 1 | E① |
| 33 | 0001000000000100 | 3 | B② | 0001000000000100 | 3 | B② | 1000100010000001 | 1 | E① | 1000100010000001 | 1 | E① |
| 34 | 0001000000100100 | 3 | B② | 0001000000100100 | 3 | B② | 1000000000100100 | 2 | E② | 1000000000100100 | 2 | E② |
| 35 | 0001000001001000 | 3 | D② | 0100001001000000 | 4 | C③ | 0001000001001000 | 3 | D② | 0100001001000000 | 4 | C③ |
| 36 | 0001000010010000 | 3 | B② | 0001000010010000 | 3 | B② | 1000000000100100 | 3 | E② | 1000000000100100 | 3 | E② |
| 37 | 0001000100100000 | 3 | B② | 0001000100100000 | 3 | B② | 1000010001000000 | 4 | E③ | 1000010001000000 | 4 | E③ |
| 38 | 0010000000001000 | 3 | D② | 0100100100000001 | 1 | C① | 0010000000001000 | 3 | D② | 0100100100000001 | 1 | C① |
| 39 | 0010000001000100 | 3 | B② | 0010000001000100 | 3 | B② | 1001000010000000 | 4 | E③ | 1001000010000000 | 4 | E③ |
| 40 | 0010000010001000 | 3 | D② | 0100010010000001 | 1 | C① | 0010000010001000 | 3 | D② | 0100010010000001 | 1 | C① |
| 41 | 0010000100010000 | 3 | B② | 0010000100010000 | 3 | B② | 1000010010000010 | 1 | E① | 1000010010000010 | 1 | E① |
| 42 | 0010001000100000 | 3 | B② | 0010001000100000 | 3 | B② | 1000001000100000 | 2 | E② | 1000001000100000 | 2 | E② |
| 43 | 0010010001000000 | 4 | B③ | 0010010001000000 | 4 | B③ | 1000010001000001 | 1 | E① | 1000010001000001 | 1 | E① |
| 44 | 0001001001000000 | 4 | B③ | 0001001001000000 | 4 | B③ | 1000001000100000 | 3 | E② | 1000001000100000 | 3 | E② |
| 45 | 0000001000000001 | 1 | A① | 0100010001000000 | 4 | C③ | 1000001000100010 | 1 | F① | 0100010001000000 | 4 | C③ |
| 46 | 0010010010000010 | 1 | B① | 0010010010000010 | 1 | B① | 1000001000100001 | 1 | E① | 1000001000100001 | 1 | E① |
| 47 | 0010000010001001 | 1 | D① | 0100001001000001 | 1 | C① | 0010000010001001 | 1 | D① | 0100001001000001 | 1 | C① |
| 48 | 0010010001000001 | 1 | B① | 0010010001000001 | 1 | B① | 1000000100010000 | 2 | E② | 1000000100010000 | 2 | E② |
| 49 | 0010001001000010 | 1 | B① | 0010001001000010 | 1 | B① | 1000000010001000 | 2 | E② | 1000000010001000 | 2 | E② |
| 50 | 0010001000100001 | 1 | B① | 0010001000100001 | 1 | B① | 1000000100010000 | 3 | E② | 1000000100010000 | 3 | E② |

FIG.4B

| DATA | T1a state = 1 Code Word | NS | GP | T2a state = 2 Code Word | NS | GP | T3a state = 3 Code Word | NS | GP | T4a state = 4 Code Word | NS | GP |
|---|---|---|---|---|---|---|---|---|---|---|---|---|
| 51 | 0001000001001001 | 1 | D① | 0100000100100001 | 1 | C① | 0001000001001001 | 1 | D① | 0100000100100001 | 1 | C① |
| 52 | 0010000100100010 | 1 | B① | 0010000100100010 | 1 | B① | 1000000100100010 | 1 | E① | 1000000100100010 | 1 | E① |
| 53 | 0010000100010001 | 1 | B① | 0010000100010001 | 1 | B① | 1000000100010001 | 1 | E① | 1000000100010001 | 1 | E① |
| 54 | 0010000010010010 | 1 | B① | 0010000010010010 | 1 | B① | 1000000010010010 | 1 | E① | 1000000010010010 | 1 | E① |
| 55 | 0010000001000010 | 1 | B① | 0010000001000010 | 1 | B① | 1000000010001001 | 1 | E① | 1000000010001001 | 1 | E① |
| 56 | 0010000000100001 | 1 | B① | 0010000000100001 | 1 | B① | 1000000001000010 | 1 | E① | 1000000001000010 | 1 | E① |
| 57 | 0000100000001001 | 1 | D① | 0100000010010001 | 1 | C① | 0000100000001001 | 1 | D① | 0100000010010001 | 1 | C① |
| 58 | 0001001001000001 | 1 | B① | 0001001001000001 | 1 | B① | 1000000000100001 | 1 | E① | 1000000000100001 | 1 | E① |
| 59 | 0001000100100001 | 1 | B① | 0001000100100001 | 1 | B① | 0100000001001001 | 1 | E① | 0100000001001001 | 1 | E① |
| 60 | 0001000010010001 | 1 | B① | 0001000010010001 | 1 | B① | 1001010000010010 | 1 | E① | 1001001000010010 | 1 | E① |
| 61 | 0001000000100010 | 1 | B① | 0001000000100010 | 1 | B① | 1001001000001001 | 1 | E① | 1001001000001001 | 1 | E① |
| 62 | 0001000000010001 | 1 | B① | 0001000000010001 | 1 | B① | 1001000100000010 | 1 | E① | 1001000100000010 | 1 | E① |
| 63 | 0000100000010010 | 1 | B① | 0000100000010010 | 1 | B① | 1000000001000100 | 2 | E② | 1000000001000100 | 2 | E② |
| 64 | 0000010000000010 | 1 | B① | 0000010000000010 | 1 | B① | 0100000001001000 | 2 | E② | 0100000001001000 | 2 | E② |
| 65 | 0010010000100000 | 2 | B② | 0010010000100000 | 2 | B② | 1000010000100000 | 2 | E② | 1000010000100000 | 2 | E② |
| 66 | 0010001000010000 | 2 | B② | 0010001000010000 | 2 | B② | 1000001000010000 | 2 | E② | 1000001000010000 | 2 | E② |
| 67 | 0010000100001000 | 2 | D② | 0100000000100010 | 1 | C① | 0010000100001000 | 2 | D② | 0100000000100010 | 1 | C① |
| 68 | 0010000010000100 | 2 | B② | 0010000010000100 | 2 | B② | 1000000100001000 | 2 | E② | 1000000100001000 | 2 | E② |
| 69 | 0010000000010000 | 2 | B② | 0010000000010000 | 2 | B② | 1000000010000100 | 2 | E② | 1000000010000100 | 2 | E② |
| 70 | 0001000010001000 | 2 | D② | 0100001000100000 | 2 | C② | 0001000010001000 | 2 | D② | 0100001000100000 | 2 | C② |
| 71 | 0001001000100000 | 2 | B② | 0001001000100000 | 2 | B② | 0100000010001000 | 2 | E② | 0100000010001000 | 2 | E② |
| 72 | 0001000000001000 | 2 | D② | 0100000100010000 | 2 | C② | 0001000000001000 | 2 | D② | 0100000100010000 | 2 | C② |
| 73 | 0001000100010000 | 2 | B② | 0001000100010000 | 2 | B② | 1000000001000100 | 3 | E② | 1000000001000100 | 3 | E② |
| 74 | 0001000001000100 | 2 | B② | 0001000001000100 | 2 | B② | 0100000001001000 | 3 | E② | 0100000001001000 | 3 | E② |
| 75 | 0000100100100000 | 2 | B② | 0000100100100000 | 2 | B② | 1000100000100000 | 3 | E② | 1000100000100000 | 3 | E② |
| 76 | 0000100010010000 | 2 | B② | 0000100010010000 | 2 | B② | 1000001000010000 | 3 | E② | 1000001000010000 | 3 | E② |
| 77 | 0000100001001000 | 2 | D② | 0100000001000100 | 2 | C② | 0000100001001000 | 2 | D② | 0100000001000100 | 2 | C② |
| 78 | 0000100000100100 | 2 | B② | 0000100000100100 | 2 | B② | 1000000100001000 | 3 | E② | 1000000100001000 | 3 | E② |
| 79 | 0000100000000100 | 2 | B② | 0000100000000100 | 2 | B② | 1000000010000100 | 3 | E② | 1000000010000100 | 3 | E② |
| 80 | 0000100000000100 | 3 | B② | 0000100000000100 | 3 | B② | 0100000010001000 | 3 | E② | 0100000010001000 | 3 | E② |
| 81 | 0000100000100100 | 3 | B② | 0000100000100100 | 3 | B② | 1000100001000000 | 4 | E③ | 1000100001000000 | 4 | E③ |
| 82 | 0000100001001000 | 3 | D① | 0100000001000100 | 3 | C② | 0000100001001000 | 3 | D② | 0100000001000100 | 3 | C② |
| 83 | 0000100010010000 | 3 | B① | 0000100010010000 | 3 | B② | 1000000010001000 | 3 | E② | 1000000010001000 | 3 | E② |
| 84 | 0000100100100000 | 3 | B① | 0000100100100000 | 3 | B② | 1001001001001000 | 2 | E② | 1001001001001000 | 2 | E② |
| 85 | 0001000000001000 | 3 | D① | 0100001000100000 | 3 | C② | 0001000000001000 | 3 | D② | 0100000100010000 | 3 | C② |
| 86 | 0001000001000100 | 3 | B① | 0001000001000100 | 3 | B② | 1001001000100100 | 2 | E② | 1001001000100100 | 2 | E② |
| 87 | 0001000010001000 | 3 | D① | 0100001000100000 | 3 | C② | 0001000010001000 | 3 | D② | 0100001000100000 | 3 | C② |
| 88 | 0001000100010000 | 3 | B① | 0001000100010000 | 3 | B② | 1001001001001000 | 3 | E② | 1001001001001000 | 3 | E② |
| 89 | 0001001000100000 | 3 | B① | 0001001000100000 | 3 | B② | 1001000010000001 | 1 | E① | 1001000010000001 | 1 | E① |
| 90 | 0010000000010000 | 3 | B① | 0010000000010000 | 3 | B② | 1000100100010010 | 1 | E① | 1000100100010010 | 1 | E① |
| 91 | 0010000010000100 | 3 | B① | 0010000010000100 | 3 | B② | 1000100100001001 | 1 | E① | 1000100100001001 | 1 | E① |
| 92 | 0010000100001000 | 3 | D① | 0100000000010001 | 1 | C① | 0010000100001000 | 3 | D② | 0100000000010001 | 1 | C② |
| 93 | 0010001000010000 | 3 | B① | 0010001000010000 | 3 | B② | 1000100010000010 | 1 | E① | 1000100010000010 | 1 | E① |
| 94 | 0010010000100000 | 3 | B① | 0010010000100000 | 3 | B② | 1000100001000001 | 1 | E① | 1000100001000001 | 1 | E① |
| 95 | 0000001000000010 | 1 | A① | 0100100100000010 | 1 | C① | 1000010010010010 | 1 | F① | 0100100100000010 | 1 | C① |
| 96 | 0000000100000001 | 1 | A① | 0100100010000001 | 1 | C① | 1000010010001001 | 1 | F① | 0100100010000001 | 1 | C① |
| 97 | 0010010010001001 | 1 | D① | 0100010000100000 | 2 | C② | 0010010010001001 | 1 | D① | 0100100010000000 | 2 | C① |
| 98 | 0010010010010010 | 1 | B① | 0010010010010010 | 1 | B① | 1001001000000000 | 2 | E② | 1001001000000100 | 2 | E② |
| 99 | 0010010001000010 | 1 | B① | 0010010001000010 | 1 | B① | 1001001000100100 | 3 | E② | 1001001000100100 | 3 | E② |
| 100 | 0010010000100001 | 1 | B① | 0010010000100001 | 1 | B① | 1000010001000010 | 1 | E① | 1000010001000010 | 1 | E① |
| 101 | 0010001001001001 | 1 | B① | 0100010010000010 | 1 | C① | 0010001001001001 | 1 | D① | 0100010010000010 | 1 | C① |
| 102 | 0010001000100010 | 1 | B① | 0010001000100010 | 1 | B① | 1000100000100001 | 1 | E① | 1000100000100001 |   | E① |

FIG.4C

| DATA | T1a state = 1 Code Word | NS | GP | T2a state = 2 Code Word | NS | GP | T3a state = 3 Code Word | NS | GP | T4a state = 4 Code Word | NS | GP |
|---|---|---|---|---|---|---|---|---|---|---|---|---|
| 103 | 0010001000010001 | 1 | B① | 0010001000010001 | 1 | B① | 1000001001001001 | 1 | E① | 1000001001001001 | 1 | E① |
| 104 | 0010000100010010 | 1 | B① | 0010000100010010 | 1 | B① | 1000001000100010 | 1 | E① | 1000001000100010 | 1 | E① |
| 105 | 0010000010000010 | 1 | B① | 0010000010000010 | 1 | B① | 1000001000010001 | 1 | E① | 1000001000010001 | 1 | E① |
| 106 | 0010000100001001 | 1 | D① | 0100001000010000 | 2 | C② | 0010000100001001 | 1 | D① | 0100001000010000 | 2 | C② |
| 107 | 0010000001000001 | 1 | B① | 0010000001000001 | 1 | B① | 1000000100010010 | 1 | E① | 1000000100010010 | 1 | E① |
| 108 | 0001001001000010 | 1 | B① | 0001001001000010 | 1 | B① | 1000000100001001 | 1 | E① | 1000000100001001 | 1 | E① |
| 109 | 0001001000100001 | 1 | B① | 0001001000100001 | 1 | B① | 1000000010000010 | 1 | E① | 1000000010000010 | 1 | E① |
| 110 | 0001000100100010 | 1 | B① | 0001000100100010 | 1 | B① | 1000000001000001 | 1 | E① | 1000000001000001 | 1 | E① |
| 111 | 0001000100010001 | 1 | B① | 0001000100010001 | 1 | B① | 0100000010001001 | 1 | E① | 0100000010001001 | 1 | E① |
| 112 | 0001000010010010 | 1 | B① | 0001000010010010 | 1 | B① | 1001001001001001 | 1 | E① | 1001001001001001 | 1 | E① |
| 113 | 0001000001000010 | 1 | B① | 0001000001000010 | 1 | B① | 1001001000100010 | 1 | E① | 1001001000100010 | 1 | E① |
| 114 | 0001000010001001 | 1 | D① | 0100010000100000 | 3 | C② | 0001000010001001 | 1 | D① | 0100010000100000 | 3 | C② |
| 115 | 0001000000100001 | 1 | B① | 0001000000100001 | 1 | B① | 1001001000010001 | 1 | E① | 1001001000010001 | 1 | E① |
| 116 | 0000100100100001 | 1 | B① | 0000100100100001 | 1 | B① | 1001000100010010 | 1 | E① | 1001000100010010 | 1 | E① |
| 117 | 0000100010010001 | 1 | B① | 0000100010010001 | 1 | B① | 1001000100001001 | 1 | E① | 1001000100001001 | 1 | E① |
| 118 | 0000100001001001 | 1 | D① | 0100010001000001 | 1 | C① | 0000100001001001 | 1 | D① | 0100010001000001 | 1 | C① |
| 119 | 0000100000100010 | 1 | B① | 0000100000100001 | 1 | B① | 1000100100100100 | 2 | E② | 1000100100100100 | 2 | E② |
| 120 | 0000100000010001 | 1 | B① | 0000100000010010 | 1 | B① | 1000100100000100 | 2 | H② | 1000100100000100 | 2 | H② |
| 121 | 0000010000001001 | 1 | D① | 0100001001000010 | 1 | C① | 0000010000001001 | 1 | D① | 0100001001000010 | 1 | C① |
| 122 | 0000010000010010 | 1 | B① | 0000010000010010 | 1 | B① | 1000100000100000 | 2 | E② | 1000100000100000 | 2 | E② |
| 123 | 0010010010000100 | 2 | B② | 0010010010000100 | 2 | B② | 1000010010000100 | 2 | E② | 1000010010000100 | 2 | E② |
| 124 | 0010010000010000 | 2 | B② | 0010010000010000 | 2 | B② | 1000010000010000 | 2 | E② | 1000010000010000 | 2 | E② |
| 125 | 0010001000001000 | 2 | D② | 0100001000100001 | 1 | C① | 0010001000001000 | 2 | D② | 0100001000100001 | 1 | C① |
| 126 | 0010001001000100 | 2 | B② | 0010001001000100 | 2 | B② | 1000001001000100 | 2 | E② | 1000001001000100 | 2 | E② |
| 127 | 0001000100001000 | 2 | D② | 0100000100100010 | 1 | C① | 0001000100001000 | 2 | D② | 0100000100100010 | 1 | C① |
| 128 | 0010000100100100 | 2 | B② | 0010000100100100 | 2 | B② | 1000001000001000 | 2 | E② | 1000001000001000 | 2 | E② |
| 129 | 0000100010001000 | 2 | D② | 0100000100010001 | 1 | C① | 0000100010001000 | 2 | D② | 0100000100010001 | 1 | C① |
| 130 | 0010000100000100 | 2 | B② | 0010000100000100 | 2 | B② | 1000000100100100 | 2 | E② | 1000000100100100 | 2 | E② |
| 131 | 0010000000100000 | 2 | B② | 0010000000100000 | 2 | B② | 1001001000000100 | 3 | E② | 1001001000000100 | 3 | E② |
| 132 | 0001001000010000 | 2 | B② | 0001001000010000 | 2 | B② | 1000100100100100 | 3 | E② | 1000100100100100 | 3 | E② |
| 133 | 0000100000001000 | 2 | D② | 0100000010010010 | 1 | C① | 0000100000001000 | 2 | D② | 0100000010010010 | 1 | C① |
| 134 | 0001000010000100 | 2 | B② | 0001000010000100 | 2 | B② | 1000100000100000 | 3 | E② | 1000100000100000 | 3 | E② |
| 135 | 0001000000010000 | 2 | B② | 0001000000010000 | 2 | B② | 1000010010000100 | 3 | E② | 1000010010000100 | 3 | E② |
| 136 | 0000100100010000 | 2 | B② | 0000100100010000 | 2 | B② | 1000010000010000 | 3 | E② | 1000010000010000 | 3 | E② |
| 137 | 0000100001000100 | 2 | B② | 0000100001000100 | 2 | B② | 1000001001000100 | 3 | E② | 1000001001000100 | 3 | E② |
| 138 | 0000010001001000 | 2 | D② | 0100000001000010 | 1 | C① | 0000010001001000 | 2 | D② | 0100000001000010 | 1 | C① |
| 139 | 0000100010010000 | 2 | B② | 0000100010010000 | 2 | B② | 1000001000001000 | 3 | E② | 1000001000001000 | 3 | E② |
| 140 | 0000010000100100 | 2 | B② | 0000010000100100 | 2 | B② | 1001000010000010 | 1 | E① | 1001000010000010 | 1 | E① |
| 141 | 0000010000000100 | 2 | B② | 0000010000000100 | 2 | B② | 1000000100000100 | 2 | E② | 1000000100000100 | 2 | E② |
| 142 | 0000010000000100 | 3 | B② | 0000010000000100 | 3 | B② | 1000000100100100 | 3 | E② | 1000000100100100 | 3 | E② |
| 143 | 0000010000100100 | 3 | B② | 0000010000100100 | 3 | B② | 1000000100000100 | 3 | E② | 1000000100000100 | 3 | E② |
| 144 | 0000010001001000 | 3 | D② | 0100000010000100 | 2 | C② | 0000010001001000 | 3 | D② | 0100000010000100 | 2 | C② |
| 145 | 0000100010010000 | 3 | B② | 0000100010010000 | 3 | B② | 1001000001000000 | 4 | E② | 1001000001000000 | 4 | E③ |
| 146 | 0001100000001000 | 3 | D② | 0100000000010000 | 2 | C② | 0001000000001000 | 3 | D② | 0100000000010000 | 2 | C② |
| 147 | 0000100001000100 | 3 | B② | 0000100001000100 | 3 | B② | 1000000100000100 | 2 | E② | 1000000100000100 | 2 | E② |
| 148 | 0000100010001000 | 3 | D② | 0100000010000100 | 2 | C② | 0000100010001000 | 3 | D② | 0100000010000100 | 3 | C② |
| 149 | 0000100100010000 | 3 | B② | 0000100100010000 | 3 | B② | 1000000000100000 | 3 | E② | 1000000000100000 | 3 | E② |
| 150 | 0001000000010000 | 3 | B② | 0001000000010000 | 3 | B② | 0100000100001000 | 3 | E① | 0100000100001000 | 3 | E① |
| 151 | 0001000010000100 | 3 | B② | 0001000010000100 | 3 | B② | 1000000010000000 | 4 | E① | 1000000001000000 | 4 | E③ |
| 152 | 0001000100001000 | 3 | D② | 0100001000010010 | 3 | C② | 0001000100001000 | 3 | D① | 0100001000010000 | 3 | C② |
| 153 | 0001001000010000 | 3 | B② | 0001001000010000 | 3 | B② | 1001000001000001 | 1 | E① | 1001000001000001 | 1 | E① |
| 154 | 0010000000100000 | 3 | B② | 0010000000100000 | 3 | B② | 0100000100001000 | 2 | E① | 0100000100001000 | 2 | E② |

FIG. 4D

| DATA | T1a state = 1 | | | T2a state = 2 | | | T3a state = 3 | | | T4a state = 4 | | |
|---|---|---|---|---|---|---|---|---|---|---|---|---|
| | Code Word | NS | GP | Code Word | NS | GP | Code Word | NS | GP | Code Word | NS | GP |
| 155 | 0010000100000100 | 3 | B② | 0010000100000100 | 3 | B② | 1001000100100100 | 3 | E② | 1001000100100100 | 3 | E② |
| 156 | 0010000100100100 | 3 | B② | 0010000100100100 | 3 | B② | 1000100100100010 | 1 | E① | 1000100100100010 | 1 | E① |
| 157 | 0010001000001000 | 3 | D② | 0100000000100001 | 1 | C① | 0010001000001000 | 3 | D② | 0100000000100001 | 1 | C① |
| 158 | 0010001001000100 | 3 | B② | 0010001001000100 | 3 | B② | 1000100100000100 | 3 | H② | 0100100100000000 | 4 | J③ |
| 159 | 0010010000010000 | 3 | B② | 0010010000010000 | 3 | B② | 1001001001000100 | 2 | E② | 1001001001000100 | 2 | E② |
| 160 | 0010010010000100 | 3 | B② | 0010010010000100 | 3 | B② | 1001001000001000 | 2 | E② | 1001001000001000 | 2 | E② |
| 161 | 0000001000010010 | 1 | A① | 0100000000010000 | 3 | C② | 1000100100010001 | 1 | F① | 0100000000010000 | 3 | C② |
| 162 | 0000001000001001 | 1 | A① | 0100100100100100 | 2 | C② | 1000100010010010 | 1 | F① | 0100100100100100 | 2 | C② |
| 163 | 0000000100000010 | 1 | A① | 0100100100100100 | 3 | C② | 1000100010001001 | 1 | F① | 0100100100100100 | 3 | C② |
| 164 | 0000000010000001 | 1 | A① | 0100100100010010 | 1 | C① | 1000100001000010 | 1 | F① | 0100100100010010 | 1 | C① |
| 165 | 0010010010010001 | 1 | B① | 0010010010010001 | 1 | B① | 1001000100100100 | 2 | E② | 1001000100100100 | 2 | E② |
| 166 | 0010010000100010 | 1 | B① | 0010010000100010 | 1 | B① | 1001000100000100 | 2 | E② | 1001000100000100 | 2 | E② |
| 167 | 0010010001001001 | 1 | D① | 0100100100000100 | 2 | C② | 0010010001001001 | 1 | D① | 0100100100000100 | 2 | C② |
| 168 | 0010010000010001 | 1 | B① | 0010010000010001 | 1 | B① | 1001001001000100 | 3 | E② | 1001001001000100 | 3 | E② |
| 169 | 0010001000010010 | 1 | B① | 0010001000010010 | 1 | B① | 1000100000100001 | 1 | E① | 1000100000100001 | 1 | E① |
| 170 | 0010000100000010 | 1 | B① | 0010000100000010 | 1 | B① | 1000010010010001 | 1 | E① | 1000010010010001 | 1 | E① |
| 171 | 0010001000001001 | 1 | D① | 0100100000100000 | 3 | C② | 0010001000001001 | 1 | D① | 0100100000100000 | 3 | C② |
| 172 | 0010000010000001 | 1 | B① | 0010000010000001 | 1 | B① | 1000010001001001 | 1 | E① | 1000010001001001 | 1 | E① |
| 173 | 0001001000100010 | 1 | B① | 0001001000100010 | 1 | B① | 1000010000100010 | 1 | E① | 1000010000100010 | 1 | E① |
| 174 | 0001001000010001 | 1 | B① | 0001001000010001 | 1 | B① | 1000010000010001 | 1 | E① | 1000010000010001 | 1 | E① |
| 175 | 0001000100010010 | 1 | B① | 0001000100010010 | 1 | B① | 1000001000010010 | 1 | E① | 1000001000010010 | 1 | E① |
| 176 | 0001000010000010 | 1 | B① | 0001000010000010 | 1 | B① | 1000001000001001 | 1 | E① | 1000001000001001 | 1 | E① |
| 177 | 0001001001001001 | 1 | D① | 0100100010000010 | 1 | C① | 0001001001001001 | 1 | D① | 0100100010000010 | 1 | C① |
| 178 | 0001000001000001 | 1 | B① | 0001000001000001 | 1 | B① | 1000000100000010 | 1 | E① | 1000000100000010 | 1 | E① |
| 179 | 0000100100100010 | 1 | B① | 0000100100100010 | 1 | B① | 1000000010000001 | 1 | E① | 1000000010000001 | 1 | E① |
| 180 | 0001000100010001 | 1 | B① | 0001000100010001 | 1 | B① | 0100100100001001 | 1 | E① | 0100100100001001 | 1 | E① |
| 181 | 0001000100001001 | 1 | D① | 0100100000100000 | 2 | C② | 0001000100001001 | 1 | D① | 0100100000100000 | 2 | C② |
| 182 | 0000100010010010 | 1 | B① | 0000100010010010 | 1 | B① | 0100100010001001 | 1 | E① | 0100100010001001 | 1 | E① |
| 183 | 0000100001000010 | 1 | B① | 0000100001000010 | 1 | B① | 0100001001001001 | 1 | E① | 0100001001001001 | 1 | E① |
| 184 | 0001000010001001 | 1 | D① | 0100010010000100 | 3 | C② | 0000100010001001 | 1 | D① | 0100010010000100 | 3 | C② |
| 185 | 0000100000100001 | 1 | B① | 0000100000100001 | 1 | B① | 1001000000100000 | 2 | E② | 1001000000100000 | 2 | E① |
| 186 | 0000100010010001 | 1 | B① | 0000100010010001 | 1 | B① | 1000100100001000 | 2 | E② | 1000100100001000 | 2 | E② |
| 187 | 0000100000100010 | 1 | B① | 0000100000100010 | 1 | B① | 1000100010000100 | 2 | E② | 1000100010000100 | 2 | E① |
| 188 | 0000100001001001 | 1 | D① | 0100100001000001 | 1 | C① | 0000010001001001 | 1 | D① | 0100100001000001 | 1 | C① |
| 189 | 0000100000010001 | 1 | B① | 0000100000010001 | 1 | B① | 1000100000010000 | 2 | E② | 1000100000010000 | 2 | E② |
| 190 | 0000001001001000 | 2 | A② | 0100010010000100 | 2 | C② | 1000100010001000 | 2 | H② | 0100100010000100 | 2 | C② |
| 191 | 0000001000100100 | 2 | A② | 0100010000010000 | 2 | C② | 1000010001000100 | 2 | H② | 0100010000010000 | 2 | C② |
| 192 | 0000001000000100 | 2 | A② | 0100001001000100 | 2 | C② | 1000010000001000 | 2 | G② | 0100001001000100 | 2 | C② |
| 193 | 0010010010001000 | 2 | D② | 0100010000010000 | 3 | C② | 0010010010001000 | 2 | D② | 0100010000010000 | 3 | C② |
| 194 | 0010010001000100 | 2 | B② | 0010010001000100 | 2 | B② | 1000100100100 | 2 | H② | 1000001001001000 | 2 | H② |
| 195 | 0010010000001000 | 2 | D② | 0100010010010010 | 1 | C① | 0010010000001000 | 2 | D② | 0100010010010010 | 1 | C① |
| 196 | 0010001000100100 | 2 | B② | 0010001000100100 | 2 | B② | 1000100001000100 | 2 | E② | 1000001000100100 | 2 | E② |
| 197 | 0010001000000100 | 2 | B② | 0010001000000100 | 2 | B② | 1000010000000100 | 2 | H② | 1000001000000100 | 2 | H② |
| 198 | 0010001001001000 | 2 | D② | 0100010001000010 | 1 | C① | 0010001001001000 | 2 | D② | 0100010001000010 | 1 | C① |
| 199 | 0001001001000100 | 2 | B② | 0001001001000100 | 2 | B② | 0100001000001000 | 2 | E② | 0100001000001000 | 2 | E② |
| 200 | 0001000100100100 | 2 | B② | 0001000100100100 | 2 | B② | 1001000000100000 | 3 | E② | 1001000000100000 | 3 | E② |
| 201 | 0001000100000100 | 2 | B② | 0001000100000100 | 2 | B② | 1000100100001000 | 3 | E② | 1000100100001000 | 3 | E② |
| 202 | 0001001000001000 | 2 | D② | 0100010000100001 | 1 | C① | 0001001000001000 | 2 | D② | 0100010000100001 | 1 | C① |
| 203 | 0001000000100000 | 2 | B② | 0001000000100000 | 2 | B② | 1000100010000100 | 3 | E② | 1000100010000100 | 3 | E② |
| 204 | 0000100010000100 | 2 | B② | 0000100010000100 | 2 | B② | 1000010010001000 | 3 | H② | 1000010010001000 | 3 | H② |
| 205 | 0000100000010000 | 2 | B② | 0000100000010000 | 2 | B② | 1000010001000100 | 3 | H② | 1000010001000100 | 3 | H② |
| 206 | 0000100100001000 | 2 | D② | 0100001000010010 | 1 | C① | 0000100100001000 | 2 | D② | 0100001000010010 | 1 | C① |

FIG.4E

| DATA | T1a state = 1 | | | T2a state = 2 | | | T3a state = 3 | | | T4a state = 4 | | |
|---|---|---|---|---|---|---|---|---|---|---|---|---|
| | Code Word | NS | GP | Code Word | NS | GP | Code Word | NS | GP | Code Word | NS | GP |
| 207 | 0000010010001000 | 2 | D② | 0100001000010001 | 1 | C① | 0000010010001000 | 2 | D② | 0100001000010001 | 1 | C① |
| 208 | 0000010001000100 | 2 | B② | 0000010001000100 | 2 | B② | 1000001000100100 | 3 | E② | 1000001000100100 | 3 | E② |
| 209 | 0000010000001000 | 2 | D② | 0100000100010010 | 1 | C① | 0000010000001000 | 2 | D② | 0100000100010010 | 1 | C① |
| 210 | 0000001000000100 | 3 | A② | 0100000010000010 | 1 | C① | 1000010000001000 | 3 | G② | 0100000010000010 | 1 | C① |
| 211 | 0000001000100100 | 3 | A② | 0100000100100100 | 2 | C② | 1000001001001000 | 3 | H② | 0100000100100100 | 2 | C② |
| 212 | 0000001001001000 | 3 | A② | 0100000100000100 | 2 | C② | 1000001000000100 | 3 | H② | 0100000100000100 | 2 | C② |
| 213 | 0000010000001000 | 3 | D② | 0100000001000001 | 1 | C① | 0000010000001000 | 3 | D② | 0100000001000001 | 1 | C① |
| 214 | 0000010001000100 | 3 | B② | 0000010001000100 | 3 | B② | 0100001000001000 | 3 | E② | 0100001000001000 | 3 | E② |
| 215 | 0000010010001000 | 3 | D② | 0100000000100000 | 2 | C② | 0000010010001000 | 3 | D② | 0100000000100000 | 2 | C② |
| 216 | 0001000000010000 | 3 | B② | 0001000000010000 | 3 | B② | 1001001000010000 | 3 | E② | 1001001000010000 | 3 | E② |
| 217 | 0001000010000100 | 3 | B② | 0000100010000100 | 3 | B② | 1001000100000100 | 3 | E② | 1001000100000100 | 3 | E② |
| 218 | 0001000100001000 | 3 | D② | 0100000100000100 | 3 | C② | 0000100100001000 | 3 | D② | 0100000100000100 | 3 | C② |
| 219 | 0001000000100000 | 3 | B② | 0001000000100000 | 3 | B② | 0100000100001001 | 1 | E① | 0100000100001001 | 1 | E① |
| 220 | 0001000100000100 | 3 | B② | 0001000100000100 | 3 | B② | 1001001000010000 | 2 | E② | 1001001000010000 | 2 | E② |
| 221 | 0001000100100100 | 3 | B② | 0001000100100100 | 3 | B② | 1001000100001000 | 2 | E② | 1001000100001000 | 2 | E② |
| 222 | 0001001000001000 | 3 | D② | 0100000100100100 | 3 | C② | 0001001000001000 | 3 | D② | 0100000100100100 | 3 | C② |
| 223 | 0001001001000100 | 3 | B② | 0001001001000100 | 3 | B② | 1001001000001000 | 3 | E② | 1001001000001000 | 3 | E② |
| 224 | 0010001000000100 | 3 | B② | 0010001000000100 | 3 | B② | 1000100000010000 | 3 | E② | 1000100000010000 | 3 | E② |
| 225 | 0010001000100100 | 3 | B② | 0010001000100100 | 3 | B② | 1001001001000010 | 1 | E① | 1001001001000010 | 1 | E① |
| 226 | 0010001001001000 | 3 | D② | 0100001001000100 | 3 | C② | 0010001001001000 | 3 | D② | 0100001001000100 | 3 | C② |
| 227 | 0010010000001000 | 3 | D② | 0100100100000100 | 3 | C② | 0010010000001000 | 3 | D② | 0100100100000100 | 3 | C② |
| 228 | 0010010001000100 | 3 | B② | 0010010001000100 | 3 | B② | 1001000100001000 | 3 | E② | 1001000100001000 | 3 | E② |
| 229 | 0010010010001000 | 3 | D② | 0100000000100000 | 3 | C② | 0010010010001000 | 3 | D② | 0100000000100000 | 3 | C② |
| 230 | 0010000001000000 | 4 | B③ | 0010000001000000 | 4 | B③ | 1001001000100001 | 1 | E① | 1001001000100001 | 1 | E① |
| 231 | 0000001001001001 | 1 | A① | 0100100100100010 | 1 | C① | 1001000100100010 | 1 | F① | 0100100100100010 | 1 | C① |
| 232 | 0000001000100010 | 1 | A① | 0100100010000100 | 2 | C② | 1001000100010001 | 1 | F① | 0100100010000100 | 2 | C② |
| 233 | 0000001000010001 | 1 | A① | 0100100000010000 | 2 | C② | 1001000010010010 | 1 | F① | 0100100000010000 | 2 | C② |
| 234 | 0000000100010010 | 1 | A① | 0100000001000000 | 4 | C③ | 1001000010001001 | 1 | F① | 0100000001000000 | 4 | C③ |
| 235 | 0000000100001001 | 1 | A① | 0100100100010001 | 1 | C① | 1001000001000010 | 1 | F① | 0100100100010001 | 1 | C① |
| 236 | 0000000010000010 | 1 | A① | 0100100010010010 | 1 | C① | 1001000000100001 | 1 | F① | 0100100010010010 | 1 | C① |
| 237 | 0000000001000001 | 1 | A① | 0100100001000010 | 1 | C① | 1000100100100001 | 1 | F① | 0100100001000010 | 1 | C① |
| 238 | 0010010000010010 | 1 | B① | 0010010000010010 | 1 | B① | 1000100010010001 | 1 | E① | 1000100010010001 | 1 | E① |
| 239 | 0010001000000010 | 1 | B① | 0010001000000010 | 1 | B① | 1001000010000100 | 3 | E② | 1001000010000100 | 3 | E② |
| 240 | 0010010000001001 | 1 | D① | 0100100010000100 | 3 | C② | 0010010000001001 | 1 | D① | 0100100010000100 | 3 | C② |
| 241 | 0010000100000001 | 1 | B① | 0010000100000001 | 1 | B① | 1001000010000100 | 2 | E② | 1001000010000100 | 2 | E② |
| 242 | 0001001000010010 | 1 | B① | 0001001000010010 | 1 | B① | 1000000010000000 | 4 | E③ | 1000000010000000 | 4 | E③ |
| 243 | 0001000100000010 | 1 | B① | 0001000100000010 | 1 | B① | 1000100001001001 | 1 | E① | 1000100001001001 | 1 | E① |
| 244 | 0001001000001001 | 1 | D① | 0100100000100001 | 1 | C① | 0001001000001001 | 1 | D① | 0100100000100001 | 1 | C① |
| 245 | 0001000010000001 | 1 | B① | 0001000010000001 | 1 | B① | 1000100000100010 | 1 | E① | 1000100000100010 | 1 | E① |
| 246 | 0000100100010010 | 1 | B① | 0000100100010010 | 1 | B① | 1000100000010001 | 1 | E① | 1000100000010001 | 1 | E① |
| 247 | 0000100010000010 | 1 | B① | 0000100010000010 | 1 | B① | 1000100000010010 | 1 | E① | 1000100000010010 | 1 | E① |
| 248 | 0000100100001001 | 1 | D① | 0100100010010001 | 1 | C① | 0000100100001001 | 1 | D① | 0100100010010001 | 1 | C① |
| 249 | 0000100001000001 | 1 | B① | 0000100001000001 | 1 | B① | 1000100000001001 | 1 | E① | 1000100000001001 | 1 | E① |
| 250 | 0000010010010010 | 1 | B① | 0000010010010010 | 1 | B① | 1000001000000010 | 1 | E① | 1000001000000010 | 1 | E① |
| 251 | 0000010001000010 | 1 | B① | 0000010001000010 | 1 | B① | 1000000100000001 | 1 | E① | 1000000100000001 | 1 | E① |
| 252 | 0000010010001001 | 1 | D① | 0100010000100010 | 1 | C① | 0000010010001001 | 1 | D① | 0100010000100010 | 1 | C① |
| 253 | 0000010000100001 | 1 | B① | 0000010000100001 | 1 | B① | 0100100010001001 | 1 | E① | 0100100010001001 | 1 | E① |
| 254 | 0000001001000100 | 2 | A② | 0100010000010001 | 1 | C① | 1001000000010000 | 2 | G② | 0100010000010001 | 1 | C① |
| 255 | 0000001000001000 | 2 | A② | 0100001000010010 | 1 | C① | 1000100100010000 | 2 | G② | 0100001000010010 | 1 | C① |

FIG. 4F

| DATA | T1b state = 1 | | | T2b state = 2 | | | T3b state = 3 | | | T4b state = 4 | | |
|---|---|---|---|---|---|---|---|---|---|---|---|---|
| | Code Word | NS | GP | Code Word | NS | GP | Code Word | NS | GP | Code Word | NS | GP |
| 0 | 0000010010000000 | 4 | B③ | 0000010010000000 | 4 | B③ | 0100100001001000 | 2 | E② | 0100100001001000 | 2 | E② |
| 1 | 0000100100000000 | 4 | B③ | 0000100100000000 | 4 | B③ | 0100100001001000 | 3 | E② | 0100100001001000 | 3 | E② |
| 2 | 0001001000000000 | 4 | B③ | 0001001000000000 | 4 | B③ | 0100100000001001 | 1 | E① | 0100100000001001 | 1 | E① |
| 3 | 0000001001000000 | 4 | A③ | 0100010000000001 | 1 | C① | 1000001000000000 | 4 | I③ | 0100010000000001 | 1 | C① |
| 4 | 0000000100100000 | 3 | A② | 0100100000000010 | 1 | C① | 1001000000000100 | 3 | G② | 0100100000000010 | 1 | C① |
| 5 | 0000000010010000 | 3 | A② | 0100001000000000 | 4 | C③ | 1001000000100100 | 3 | G② | 0100001000000000 | 4 | C③ |
| 6 | 0000000001001000 | 3 | A② | 0100100000000100 | 2 | C② | 1001000001001000 | 3 | G② | 0100100000000100 | 2 | C② |
| 7 | 0000000001001000 | 2 | A② | 0100000100000000 | 4 | C③ | 1001000000000100 | 2 | G② | 0100000100000000 | 4 | C③ |
| 8 | 0000000010010000 | 2 | A② | 0100100010010000 | 3 | C② | 1001000000100100 | 2 | G② | 0100100010010000 | 3 | C② |
| 9 | 0000000100100000 | 2 | A② | 0100100000100100 | 2 | C② | 1001000001001000 | 2 | G② | 0100100000100100 | 2 | C② |
| 10 | 0000010001000000 | 4 | B③ | 0000010001000000 | 4 | B③ | 1001001001000000 | 4 | E③ | 1001001001000000 | 4 | E③ |
| 11 | 0000100010000000 | 4 | B③ | 0000100010000000 | 4 | B③ | 1000100001001000 | 3 | E② | 1000100001001000 | 3 | E② |
| 12 | 0001000100000000 | 4 | B③ | 0001000100000000 | 4 | B③ | 0100010001001000 | 3 | H② | 0100010001001000 | 3 | H② |
| 13 | 0010001000000000 | 4 | B③ | 0010001000000000 | 4 | B③ | 1000100000000100 | 3 | E② | 1000100000000100 | 3 | E② |
| 14 | 0000001000100000 | 3 | A② | 0100100000000100 | 3 | C② | 1001000010010000 | 3 | G② | 0100100000000100 | 3 | C② |
| 15 | 0000000100010000 | 3 | A② | 0100100010010000 | 2 | C② | 1001000100100000 | 3 | G② | 0100100010010000 | 2 | C② |
| 16 | 0000000010001000 | 3 | A② | 0100001000000001 | 1 | C① | 0100100000001000 | 3 | G② | 0100001000000001 | 1 | C① |
| 17 | 0000000001000100 | 3 | A② | 0100010000000010 | 1 | C① | 0100100010001000 | 3 | H② | 0100010000000010 | 1 | C① |
| 18 | 0000000001000100 | 2 | A② | 0100100000100100 | 3 | C② | 1001000010010000 | 2 | G② | 0100100000100100 | 3 | C② |
| 19 | 0000000010001000 | 2 | A② | 0100100100100000 | 3 | C② | 1001000100100000 | 2 | G② | 0100100100100000 | 3 | C② |
| 20 | 0000000100010000 | 2 | A② | 0100100100100000 | 2 | C② | 0100010001001000 | 2 | H② | 0100100100100000 | 2 | C② |
| 21 | 0000010001000000 | 2 | A② | 0100100000010010 | 1 | C① | 0100100000001000 | 2 | G② | 0100100000010010 | 1 | C① |
| 22 | 0000100010000001 | 1 | B① | 0000100010000001 | 1 | B① | 1000100000100100 | 3 | E② | 1000100000100100 | 3 | E② |
| 23 | 0000100100000001 | 1 | B① | 0000100100000001 | 1 | B① | 1000100010010000 | 3 | H② | 1000100010010000 | 3 | H② |
| 24 | 0001001000000001 | 1 | B① | 0001001000000001 | 1 | B① | 0100100010001000 | 2 | H② | 0100100010001000 | 2 | H② |
| 25 | 0010010000000001 | 1 | B① | 0010010000000001 | 1 | B① | 1000100000000100 | 2 | E② | 1000100000000100 | 2 | E② |
| 26 | 0000000001001001 | 1 | A① | 0100010000000100 | 3 | C② | 1000010000000001 | 1 | F① | 0100010000000100 | 3 | C② |
| 27 | 0000000100010001 | 1 | A① | 0100000100000001 | 1 | C① | 1000100000000010 | 1 | F① | 0100000100000001 | 1 | C① |
| 28 | 0000000100100001 | 1 | A① | 0100010000000100 | 2 | C② | 1001000000001001 | 1 | F① | 0100010000000100 | 2 | C② |
| 29 | 0000001001000001 | 1 | A① | 0100001000000010 | 1 | C① | 1001000000010010 | 1 | F① | 0100001000000010 | 1 | C① |
| 30 | 0000100001000000 | 4 | B③ | 0000100001000000 | 4 | B③ | 1000100000100100 | 2 | E② | 1000100000100100 | 2 | E② |
| 31 | 0001000010000000 | 4 | B③ | 0001000010000000 | 4 | B③ | 1000100001001000 | 2 | E② | 1000100001001000 | 2 | E② |
| 32 | 0010000100000000 | 4 | B③ | 0010000100000000 | 4 | B③ | 0100010000001001 | 1 | E① | 0100010000001001 | 1 | E① |
| 33 | 00000100000100000 | 3 | B② | 0000010000100000 | 3 | B② | 0100100001001001 | 1 | E① | 0100100001001001 | 1 | E① |
| 34 | 00000010000100000 | 3 | A② | 0100010000010010 | 1 | C① | 1000100100100000 | 3 | G② | 0100010000010010 | 1 | C① |
| 35 | 0000000100001000 | 3 | A② | 0100100000010001 | 1 | C① | 1001000000001000 | 3 | G② | 0100100000010001 | 1 | C① |
| 36 | 0000000010000100 | 3 | A② | 0100000010000000 | 4 | C③ | 1001000001000100 | 3 | H② | 0100000010000000 | 4 | C③ |
| 37 | 0000100000100000 | 2 | B② | 0000010000100000 | 2 | B② | 1000001000000001 | 1 | E① | 1000001000000001 | 1 | E① |
| 38 | 0000000010000100 | 2 | A② | 0100010000100100 | 3 | C② | 1000100010010000 | 2 | H② | 0100010000100100 | 3 | C② |
| 39 | 0000000100001000 | 2 | A② | 0100010000100100 | 2 | C② | 1000100100100000 | 2 | G② | 0100010000100100 | 2 | C② |
| 40 | 0000001000010000 | 2 | A② | 0100100000100010 | 1 | C① | 1001000000001000 | 2 | G② | 0100100000100010 | 1 | C① |
| 41 | 0000010001000001 | 1 | B① | 0000010001000001 | 1 | B① | 1000010000000010 | 1 | E① | 1000010000000010 | 1 | E① |
| 42 | 0000010010000010 | 1 | B① | 0000010010000010 | 1 | B① | 1000000100000000 | 4 | E③ | 1000000100000000 | 4 | E③ |
| 43 | 0000100010000001 | 1 | B① | 0000100010000001 | 1 | B① | 1001000001000100 | 2 | H② | 1001000001000100 | 2 | H② |
| 44 | 0000100100000010 | 1 | B① | 0000100100000010 | 1 | B① | 1000100000001001 | 1 | E① | 1000100000001001 | 1 | E① |
| 45 | 0001001000000001 | 1 | B① | 0001001000000001 | 1 | B① | 1001000010001000 | 3 | E② | 1001000010001000 | 3 | E② |
| 46 | 0001001000000010 | 1 | B① | 0001001000000010 | 1 | B① | 1001000100010000 | 3 | E② | 1001000100010000 | 3 | E② |
| 47 | 0010001000000001 | 1 | B① | 0010001000000001 | 1 | B① | 1000100000010010 | 1 | E① | 1000100000010010 | 1 | E① |
| 48 | 0010010000000010 | 1 | A① | 0010010000000010 | 1 | C① | 0100010000001000 | 3 | E② | 0100010000001000 | 3 | E② |
| 49 | 0000000001000010 | 1 | A① | 0100100010010001 | 1 | C① | 1001000000010001 | 1 | F① | 0100100010010001 | 1 | C① |
| 50 | 0000000010001001 | 1 | A① | 0100100001000100 | 3 | C② | 1001000000100010 | 1 | F① | 0100100001000100 | 3 | C② |

FIG.4G

| DATA | T1b state = 1 | | | T2b state = 2 | | | T3b state = 3 | | | T4b state = 4 | | |
|---|---|---|---|---|---|---|---|---|---|---|---|---|
| | Code Word | NS | GP | Code Word | NS | GP | Code Word | NS | GP | Code Word | NS | GP |
| 51 | 0000000010010010 | 1 | A① | 0100010010010000 | 3 | C② | 1001000001001001 | 1 | F① | 0100010010010000 | 3 | C② |
| 52 | 0000000100010001 | 1 | A① | 0100010010010000 | 2 | C② | 1001000010010001 | 1 | F① | 0100010010010000 | 2 | C② |
| 53 | 0000000100100010 | 1 | A① | 0100100001000100 | 2 | C② | 1001000100100001 | 1 | F① | 0100100001000100 | 2 | C② |
| 54 | 0000001000100001 | 1 | A① | 0100100100100001 | 1 | C① | 1001001001000001 | 1 | F① | 0100100100100001 | 1 | C① |
| 55 | 0000001001000010 | 1 | A① | 0100100100010000 | 3 | C② | 0100001000001001 | 1 | F① | 0100100100010000 | 3 | C② |
| 56 | 0001000001000000 | 4 | B③ | 0001000001000000 | 4 | B③ | 1001001000100000 | 3 | E② | 1001001000100000 | 3 | E② |
| 57 | 0010000010000000 | 4 | B③ | 0010000010000000 | 4 | B③ | 1001000010001000 | 2 | E② | 1001000010001000 | 2 | E② |
| 58 | 0010010010010000 | 3 | B② | 0010010010010000 | 3 | B② | 1001001001010000 | 2 | E② | 1001001001010000 | 2 | E② |
| 59 | 0010010001001000 | 3 | D② | 0100100100010000 | 2 | C② | 0010010001001000 | 3 | D② | 0100100100010000 | 2 | C② |
| 60 | 0010010000100100 | 3 | B② | 0010010000100100 | 3 | B② | 1001001000100000 | 2 | E② | 1001001000100000 | 2 | E② |
| 61 | 0010010000000100 | 3 | B② | 0010010000000100 | 3 | B② | 0100001001001000 | 2 | E② | 0100001001001000 | 2 | E② |
| 62 | 0001001001001000 | 3 | D② | 0100000010000001 | 1 | C① | 0001001001001000 | 3 | D② | 0100000010000001 | 1 | C① |
| 63 | 0001001000100100 | 3 | B② | 0001001000100100 | 3 | B② | 0100001001001000 | 3 | E② | 0100001001001000 | 3 | E② |
| 64 | 0001001000000100 | 3 | B② | 0001001000000100 | 3 | B② | 0100010010001000 | 3 | E② | 0100010010001000 | 3 | E② |
| 65 | 0000100100100100 | 3 | B② | 0000100100100100 | 3 | B② | 0100100100001000 | 3 | E② | 0100100100001000 | 3 | E② |
| 66 | 0000100100000100 | 3 | B② | 0000100100000100 | 3 | B② | 1000010000000100 | 3 | E② | 1000010000000100 | 3 | E② |
| 67 | 0000100000100000 | 3 | B② | 0000100000100000 | 3 | B② | 1000010000100100 | 3 | E② | 1000010000100100 | 3 | E② |
| 68 | 0000010010000100 | 3 | B② | 0000010010000100 | 3 | B② | 1000010001001000 | 3 | E② | 1000010001001000 | 3 | E② |
| 69 | 0000010000010000 | 3 | B② | 0000010000010000 | 3 | B② | 1000010010010000 | 3 | E② | 1000010010010000 | 3 | E② |
| 70 | 0000001001000100 | 3 | A② | 0100001000000100 | 2 | C② | 1000100000001000 | 3 | H② | 0100001000000100 | 3 | C② |
| 71 | 0000001000001000 | 3 | A② | 0100100000010000 | 3 | C② | 1000100010001000 | 3 | G② | 0100100000010000 | 3 | C② |
| 72 | 0000000100100100 | 3 | A② | 0100010001000100 | 3 | C② | 1000100100010000 | 3 | G② | 0100010001000100 | 3 | C② |
| 73 | 0000000100000100 | 3 | A② | 0100001000100100 | 3 | C② | 1001000000010000 | 3 | G② | 0100001000100100 | 3 | C② |
| 74 | 0000010000010000 | 2 | B② | 0000010000010000 | 2 | B② | 1000100001000100 | 3 | H② | 1000100001000100 | 3 | H② |
| 75 | 0001001001001000 | 2 | D② | 0100001000000100 | 3 | C② | 0001001001001000 | 2 | D② | 0100001000000100 | 3 | C② |
| 76 | 0000100100000100 | 2 | B② | 0000010010000100 | 2 | B② | 0100010000001000 | 2 | E② | 0100010000001000 | 2 | E② |
| 77 | 0000100000100000 | 2 | B② | 0000100000100000 | 2 | B② | 0100010010001000 | 2 | E② | 0100010010001000 | 2 | E② |
| 78 | 0010010001001000 | 2 | D② | 0100000100000010 | 1 | C① | 0010010001001000 | 2 | D② | 0100000100000010 | 1 | C① |
| 79 | 0000100100000100 | 2 | B② | 0000100100000100 | 2 | B② | 0100100100001000 | 2 | E② | 0100100100001000 | 2 | E② |
| 80 | 0000100100100100 | 2 | B② | 0000100100100100 | 2 | B② | 1000010000000100 | 2 | E② | 1000010000000100 | 2 | E② |
| 81 | 0001001000000100 | 2 | B② | 0001001000000100 | 2 | B② | 1000010000100100 | 2 | E② | 1000010000100100 | 2 | E② |
| 82 | 0001001000100100 | 2 | B② | 0001001000100100 | 2 | B② | 1000010001001000 | 2 | E② | 1000010001001000 | 2 | E② |
| 83 | 0010010000000100 | 2 | B② | 0010010000000100 | 2 | B② | 1000010010010000 | 2 | E② | 1000010010010000 | 2 | E② |
| 84 | 0010010000100100 | 2 | B② | 0010010000100100 | 2 | B② | 1000100000001000 | 2 | H② | 1000100000001000 | 2 | H② |
| 85 | 0010010010010000 | 2 | B② | 0010010010010000 | 2 | B② | 0100010001001001 | 1 | E① | 0100010001001001 | 1 | E① |
| 86 | 0000000100000100 | 2 | A② | 0100001000100100 | 2 | C② | 1000100001001000 | 2 | H② | 0100001000100100 | 2 | C② |
| 87 | 0000000100100100 | 2 | A② | 0100010001000100 | 2 | C② | 1000100010001000 | 2 | G② | 0100010001000100 | 2 | C② |

| CODE | DSV VARIANT FOR CWLL=L | ALLOCATED INPUT SIGNAL VALUE | | |
|---|---|---|---|---|
| 0010010010000000 | +6 | 0 | | |
| 0010001001000000 | +6 | 1 | | |
| 0010000100100000 | +6 | 2 | | |
| 0010000010010000 | +6 | 3 | 88 | |
| ⋮ | ⋮ | ⋮ | | |
| ⋮ | ⋮ | ⋮ | | TABLE T1a |
| 0000100000100100 | +2 | 87 | | |
| 0000100000000100 | +2 | 88 | | |
| 0000100000010010 | +2 | 89 | | |
| 0010010010010010 | 0 | 90 | 168 | |
| ⋮ | ⋮ | ⋮ | | |
| ⋮ | ⋮ | ⋮ | | |
| 0000010010010001 | -2 | 255 | | |
| 0000100000010000 | -2 | 87 | | |
| 0000010000010001 | -2 | 86 | | |
| 0010010010010000 | -4 | 85 | | |
| ⋮ | ⋮ | ⋮ | 88 | TABLE T1b |
| ⋮ | ⋮ | ⋮ | | |
| 0000100100000000 | -10 | 1 | | |
| 0000010010000000 | -10 | 0 | | |

FIG.6

| CODE | DSV VARIANT FOR CWLL=L | ALLOCATED INPUT SIGNAL VALUE | | |
|---|---|---|---|---|
| 0100100100000000 | +8 | 0 | | |
| 0100010010000000 | +8 | 1 | | |
| 0100001001000000 | +8 | 2 | | |
| 0100000100100000 | +8 | 3 | 88 | |
| ⋮ | ⋮ | ⋮ | | |
| 0100000100000100 | +2 | 87 | | TABLE T2a |
| 0100000100000100 | +2 | UNUSED | | |
| 0100000001000001 | +2 | 88 | | |
| 0100000000100000 | +2 | 89 | | |
| 0010010010000010 | +2 | 90 | 168 | |
| ⋮ | ⋮ | ⋮ | | |
| 0000010000100010 | -2 | 255 | | |
| 0000010000010001 | -2 | UNUSED | | |
| 0100100100100000 | -4 | 87 | | |
| 0100100010010000 | -4 | 86 | | |
| 0100100000100100 | -4 | 85 | | |
| ⋮ | ⋮ | ⋮ | 88 | TABLE T2b |
| ⋮ | ⋮ | ⋮ | | |
| 0000100100000000 | -10 | 1 | | |
| 0000010010000000 | -10 | 0 | | |

FIG.7

| CODE | DSV VARIANT FOR CWLL=L | ALLOCATED INPUT SIGNAL VALUE | | |
|---|---|---|---|---|
| 1001001000000000 | +10 | 0 | | |
| 1000100100000000 | +10 | 1 | | |
| 1000010010000000 | +10 | 2 | | |
| 1000001001000000 | +10 | 3 | 88 | |
| : | : | : | | |
| : | : | : | | TABLE T3a |
| 1000000000100000 | +4 | 87 | | |
| 0100000100001000 | +4 | 88 | | |
| 0100000010001001 | +4 | 89 | | |
| 0010000010001000 | +4 | 90 | 168 | |
| : | : | : | | |
| : | : | : | | |
| 1001000000010001 | −2 | 255 | | |
| 1001000000001000 | −2 | 87 | | |
| 1000100100100000 | −2 | 86 | | |
| 1000100010010000 | −2 | 85 | | |
| : | : | : | 88 | TABLE T3b |
| : | : | : | | |
| 0000100100001001 | −4 | 1 | | |
| 0000010010001001 | −4 | 0 | | |

FIG.8

| CODE | DSV VARIANT FOR CWLL=L | ALLOCATED INPUT SIGNAL VALUE | | |
|---|---|---|---|---|
| 1001001000000000 | +10 | 0 | | |
| 1000100100000000 | +10 | 1 | | |
| 1000010010000000 | +10 | 2 | | |
| 1000001001000000 | +10 | 3 | 88 | |
| : | : | : | | |
| : | : | : | | |
| 1000010010010010 | +4 | 87 | | TABLE T4a |
| 1000010010001001 | +4 | UNUSED | | |
| 1000010010000100 | +4 | 88 | | |
| 1000010001000010 | +4 | 89 | | |
| 1000010000100001 | +4 | 90 | 168 | |
| : | : | : | | |
| : | : | : | | |
| 0100000001000000 | 0 | 255 | | |
| 1001001001000001 | -2 | UNUSED | | |
| 1001001000100000 | -2 | 87 | | |
| 1001000100100001 | -2 | 86 | | |
| 1001000100010000 | -2 | 85 | | |
| : | : | : | 88 | TABLE T4b |
| : | : | : | | |
| 0100010000000001 | -6 | 1 | | |
| 0100001000000000 | -6 | 0 | | |

FIG.9

SIGNAL MODULATING METHOD, SIGNAL MODULATING APPARATUS, SIGNAL DEMODULATING METHOD AND SIGNAL DEMODULATING APPARATUS

DESCRIPTION

1. Technical Field

This invention relates to a signal modulating method, a signal modulating apparatus, a signal demodulating method and a signal demodulating apparatus which are used for recording or reproducing digital signals, such as, digital speech signals, digital video signals and data, in a recording medium, and for example, to the signal modulating method, the signal modulating apparatus, the signal demodulating method and the signal demodulating apparatus which may be adapted for a mastering device for a read-only optical disc or a recording/reproducing device for a re-writable optical disc.

2. Background Art

When recording digital signals, such as digital speech signals, digital video signals or data, error correction code data is first appended to the digital signals, and the resulting data is routed to a modulating circuit where it is converted by channel coding into the code suited to the characteristics of a recording/reproducing system.

An optical disc, such as, a compact disc (CD), is a recording medium having a wide field of application as a package medium for picture information or as a storage device for a computer. The optical disc system reproduces signals recorded on a reflective surface of the disc via a transparent substrate having a thickness of the order of 1.2 mm. On the optical disc, information such as digitized audio signals, video signals or digital data, is recorded. In this case, the error correction code data is appended to the digital signals, and the resulting data is routed to a modulating circuit where it is converted by so-called channel coding into code data suited to the characteristics of the recording/reproducing system.

The signal format of the above-mentioned compact disc (CD) system is summarized as follows:

| | |
|---|---|
| sampling frequency | 44.1 kHz |
| number of quantizing bits | 16 (linear) |
| modulation system | EFM |
| channel bit rate | 4.3218 Mb/s |
| error correction system | CIRC |
| data transmitting rate | 2.034 Mb/s |

The modulation system employed is 8–14 conversion or EFM.

With the EFM, an input 8-bit code, referred to hereinafter as a symbol, is converted into a 14 channel bit code, to which a frame synchronization signal of 24 channel bits and a subcode of 14 channel bits are appended and the neighboring codes are interconnected by merging bits of 3 channel bits. The resulting data is recorded by the NRZI modulation system.

FIG. 1 shows a frame structure of the CD system.

Referring to FIG. 1, 24 symbol data (music signals) and 8 symbol parity, entering a modulating circuit from a cross-interleave Reed-Solomon code (CIRC) encoder during a sync frame (6 sample value domains, six samples each of the L and R channels, with each sample being 16-bit data) are transformed into 14 channel bits and connected by merging bits of three channel bits to give 588 channel bits per frame. The resulting data is recorded by the NRZI system at a channel bit rate of 4.3218 Mbps.

The respective symbols entering the modulating circuit are transformed, with reference to a lookup table composed of a ROM, into a channel bit pattern in which the number of "0"s between "1" and "1" is not less than 2 and not more than 10. The channel bit pattern of a frame synchronization signal Sf is "100000000001000000000010" in binary expression. As for the merging bit pattern, one of "000", "001", "010" and "100" is selected. Each sub-coding frame is made up of 98 frames. As the subcode for the 0'th and first frames, the subcode sync signal S0 (="00100000000001") and S1 (="00000000010010") are appended (see FIG. 2).

FIG. 3 shows, for a typical sample value of input data, a channel bit pattern after EFM and a digital sum variation (DSV).

Each 16-bit sample is split into upper 8 bits and lower 8 bits each of which is entered to the modulation circuit via a CIRC encoder for 8–14 conversion to produce 14 channel-bit information bits. Not less than 2 and not more than 10 "0"s are interposed between "1" and "1" of the information bits, as previously described. One of the merging bits "000", "001", "010" and "100" is selected. This rule is observed at all times at the connecting portions of the 14 information bits, so that EFM signals based on 17-channel bits are generated and outputted from the modulating circuit at 4.3218 Mbps. The number of channel bits is 27 in the case of the frame synchronization signal Sf.

Since not less than 2 and not more than 10 channel bits are interposed between an optional channel bit "1" and the next channel bit "1", the period during which the high level or the low level of the NRZI recording waveform continues, that is the recording wavelength, is necessarily not less than 3T and not more than 11T (see FIG. 3).

In this case, the shortest recording wavelength is 3T and the longest recording wavelength is 11T, with T being a period of a channel clock of 4.3218 MHz. This is referred to hereinafter as the 3T~11T rule of the EFM modulation regulation.

The digital sum value or variation (DSV) is now considered as an index of the dc balance of the NRZI recording waveform. The DSV is given as a time integral of the recording waveform. That is, the variant of the DSV when the high level of the recording waveform has continued for a unit time T is +1, while the variant of the DSV when the low level of the recording waveform has continued for a unit time T is −1.

The time change of DSV when the initial value of DSV at time $t_0$ is assumed to be zero is given at the lower most portion of FIG. 3. The modulated signal during the time since $t_1$ until $t_2$ is not uniquely determined by the 17-channel bit pattern "01000001000001001", but depends on the modulated signals level at time $t_1$, that is on the ultimate level of the modulated signal waveform during the time interval from time $t_0$ until time $t_1$ (referred to hereinafter as CWLL).

Thus the modulated signal waveform illustrated is that for the CWLL at time $t_0$ being at a low level (CWLL="0"). The modulated signal waveform for CWLL="1" (high level) is inverted from the pattern for CWLL="0" so that the high and low levels are inverted to low and high levels, respectively.

Similarly, the DSV is also increased or decreased depending upon the CWLL, such that, if CWLL="0" at time $t_0$, the DSV variant with the information pattern "01000100100010" (referred to hereinafter as 14 NWD), that is the DSV variant during the time period from $t_0$ until $t_0+14$, is +2, as shown in FIG. 3. Conversely, if CWLL="1" at time $t_0$, 14 NWD=−2. The DSV variant since time $t_0+14$ until $t_1+14$ is referred to as 17 NWD.

The merging bits, inserted since time $t_0+14$ until time $t_1$, is now explained. Of the four margin bits "000", "001", "010" and "100", "001" or "100" cannot be inserted under the abovementioned 3T~11T rule, such that only "010" or "000" can be inserted. That is, if the number of "0"s at the trailing end of the previous information bit pattern, outputted before the merging bit, is B, and the number of "0"s at the leading end of the subsequently outputted current information bit pattern is A, since B=1 and A=1, the leading and trailing ends of the merging bit must be "0" and "0", such that the merging bit pattern that can be inserted becomes "0X0", where X is arbitrary (don't care).

In the lower most portion of FIG. 3, there is shown the DSV with the bits "010" inserted as merging bits, by a solid line, while there is shown the DSV with the bits "000" inserted as merging bits, by a broken line.

In general, the merging bits to be inserted at a connecting point need to be selected so that the 3T~11T rule of the modulation regulation will be met. Similarly, such merging bits are prohibited which, when inserted, will produce a repetition by two times of a 11T pattern which is the same as the 11T frame synchronization pattern.

Of the merging bits satisfying the above requirements, such merging bits are selected as optimum merging bits which, when inserted, will produce the smallest absolute value of the cumulative DSV from the merging bit until the end of the next information bit pattern connected to the prevailing cumulative DSV.

In the example of FIG. 3, the DSV at time $t_1+14$ when the merging bits "010" are inserted is +3, while the DSV at the same time point when the merging bits "000" are inserted is −1, so that the merging bits "000" are selected.

The merging bits, found by the above-described algorithm, satisfy the 3T~11T rule of the modulation regulation at the connecting portion between two 14-bit data, while prohibiting generation of an erroneous frame sync signal and approaching the cumulative DSV of the EFM signal to a value as close to zero as possible.

Meanwhile, with the conventional EFM system, since the shortest run-length is limited to two, two merging bits suffice if for the purpose of coping with run-length limitations. If the number of the merging bits can be reduced to two, the data recording density may be increased by a factor of 17/16 without altering the physical size such as the recording wavelength.

However, there are only three sorts of the 2-bit merging bits. In addition, it is a frequent occurrence that only one of the three sorts of the merging bits can be inserted because of limitations such as those imposed by run-length. Thus, with the conventional DSV control system, there exist a large number of domains in which it is impossible to control the DSV. Consequently, low-frequency components of the modulated signals cannot be sufficiently suppressed to affect servo stability or the data error rate on data demodulation.

In view of the foregoing, it is a principal object of the present invention to provide a signal modulating method, a signal modulating apparatus, a signal demodulating method and a signal demodulating apparatus whereby the input M bits, such as an input 8-bit code string, is directly transformed into N-channel bits, such as 16 channel bits, without employing the above-mentioned merging bits at the time of signal modulation, thereby reducing ill effects on the DSV control and also enabling sufficient suppression of the low-frequency components.

DISCLOSURE OF THE INVENTION

According to the present invention, there is provided a signal modulating method for converting an M-bit based data string into an N-bit based code string, where M and N are integers having a relation of M<N, and for connecting an N-bit code to a next N-bit code, the method including: a first step of receiving the M-bit based data string as an input signal value; a second step of converting the M-bit data into the N-bit code in accordance with a conversion table; and a third step of outputting the N-bit based code string as a modulation result. The conversion table is constituted by first and second sub-tables including plural code groups, respectively. The plural code groups include different codes for the same input. The second sub-table is a table which is partly duplexed with the first sub-table and is produced by allocating different codes to data of first input data to second input data of the first sub-table. The first and second sub-tables are so designed that code sets of the duplexed portions take variants of digital sum variations which are opposite in sign. Codes are allocated to all the code groups in the duplexed portions of the first and second sub-tables with respect to input data sequentially from a code having a maximum absolute value of variant of the digital sum variation.

According to the present invention, there is also provided a signal modulating apparatus for converting an M-bit based data string into an N-bit based code string, where M and N are integers having a relation of M<N, and for connecting an N-bit code to a next N-bit code, the apparatus including: receiving means for receiving the M-bit based data string as an input signal value; conversion means for converting the M-bit data into the N-bit code in accordance with a conversion table; and output means for outputting the N-bit based code string as a modulation result. The conversion table is constituted by first and second sub-tables including plural code groups, respectively. The plural code groups include different codes for the same input. The second sub-table is a table which is partly duplexed with the first sub-table and is produced by allocating different codes to data of first input data to second input data of the first sub-table. The first and second sub-tables are so designed that code sets of the duplexed portions take variants of digital sum variations which are opposite in sign. Codes are allocated to all unit tables in the duplexed portions of the first and second sub-tables with respect to input data sequentially from a code having the maximum absolute value of variant of the digital sum variation.

According to the present invention, there is also provided a signal demodulating method for inversely converting an N-bit based code string to generate an M-bit based data string, where M and N are integers having a relation of M<N, the method including: a first step of receiving an N-bit based input code string; a second step of inversely converting the N-bit input code into M-bit data in accordance with an inverse conversion table; and a third step of outputting an M-bit based data string as a demodulation result. The inverse conversion table is constituted by first and second sub-tables including plural code groups, respectively. The plural code groups have the same output data for different input codes. The second sub-table is a table which is partly duplexed with the first sub-table and is produced by allocating different input codes to data from first output data to second output data of the first sub-table. The first and second sub-tables are so designed that code sets in the duplexed portions take variants of digital sum variations which are opposite in sign. To all the code groups in the duplexed portions of the first and second sub-tables, output data is allocated sequentially from a code having the maximum absolute value of variant of the digital sum variation.

According to the present invention, there is also provided a signal demodulating apparatus for inversely converting an N-bit based code string to generate an M-bit based data string, where M and N are integers having a relation of M<N, the apparatus including: receiving means for receiving an N-bit based input code string; inverse conversion means for inversely converting the N-bit input code into M-bit data in accordance with an inverse conversion table; and output means for outputting an M-bit based data string as a demodulation result. The inverse conversion table is constituted by first and second sub-tables including plural code groups, respectively. The plural code groups have the same output data for different input codes. The second sub-table is a table which is partly duplexed with the first sub-table and is produced by allocating different input codes to data from first output data to second output data of the first sub-table. The first and second sub-tables are so designed that code sets in the duplexed portions take variants of digital sum variations which are opposite in sign. To all the code groups in the duplexed portions of the first and second sub-tables, output data is allocated sequentially from a code having the maximum absolute value of variant of the digital sum variation.

According to the present invention, there is also provided a signal modulating method for converting an M-bit based data string with reference to a predetermined conversion table into an N-bit based code string, where M and N are integers having a relation of M<N, and for connecting an N-bit code to a next N-bit code. The conversion table is produced by: a first step of selecting codes meeting predetermined modulation rules from all possible patterns of N-bit based codes; a second step of classifying the selected codes into plural code groups in accordance with plural different code conditions; a third step of calculating variants of digital sum variations of the codes of the plural code groups; a fourth step of arraying the codes sequentially from a code having a greater variant of digital sum variation of the plural code groups; a fifth step of allocating the arrayed codes to the M-bit data from the code having a greater variant of digital sum variation of the code groups to generate a first sub-table; and a sixth step of allocating codes other than the codes included in the first sub-table of the codes meeting the predetermined modulation rules, to first data to second data of all data, from a code having a greater absolute value of variant of the digital sum variation, to generate a second sub-table having a portion duplexed with the first sub-table.

With this invention, since in the duplexed portions of the conversion tables, the corresponding code sets have variants of digital sum variations (DSV) which are opposite in sign and close to each other in absolute value, DSV control can be achieved by selecting one of the duplexed portions without using a margin bit used in conventional modulation. In addition, since the conversion table in which codes having greater absolute values of variants of the digital sum values are allocated sequentially to the duplexed portion is used, low frequency components of the modulated signals are sufficiently suppressed.

BRIEF DESCRIPTION OF THE DRAWINGS

FIGS. 4a–4g show examples of conversion table employed in an embodiment of the present invention.

FIG. 6 shows an example of a unit table with the state value being 1.

FIG. 7 shows an example of a unit table with the state value being 2.

FIG. 8 shows an example of a unit table with the state value being 3.

FIG. 9 shows an example of a unit table with the state value being 4.

BEST MODE OF CARRYING OUT THE INVENTION

Figure 1:
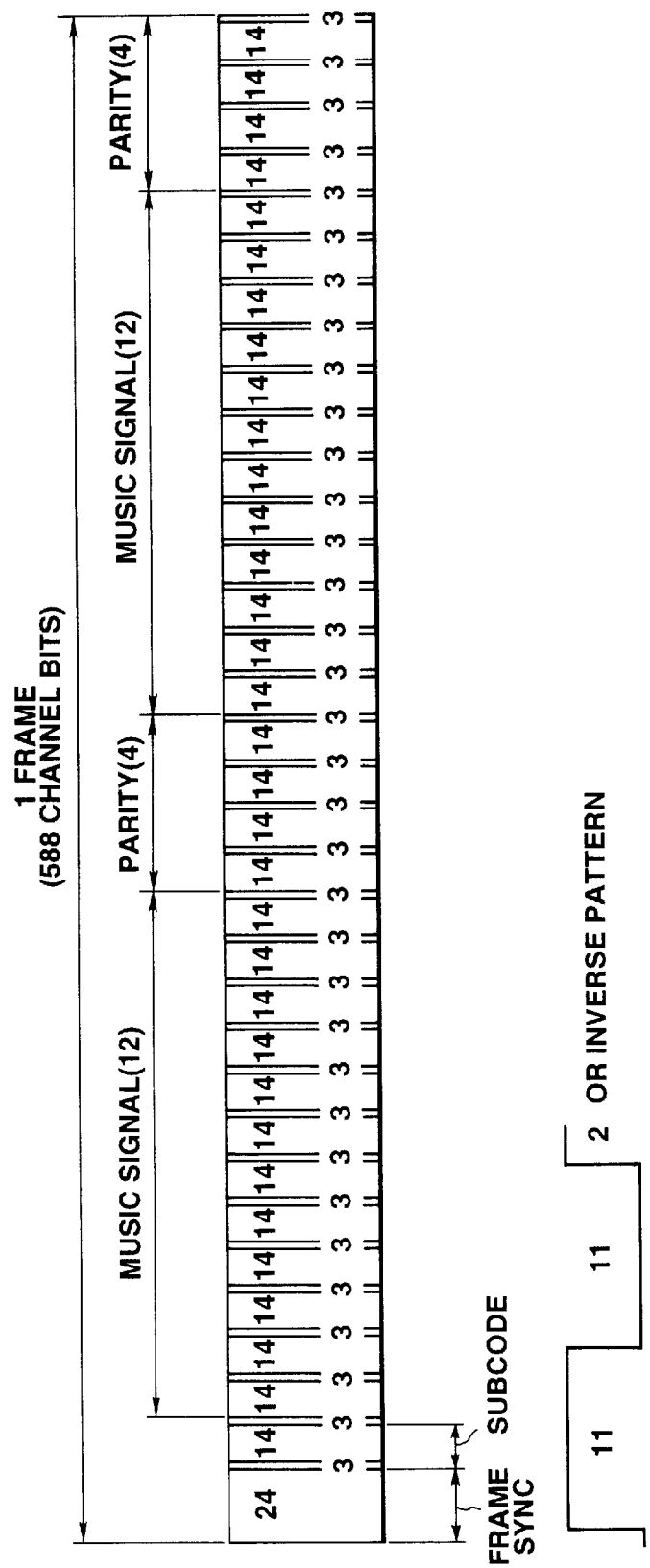
FIG. 1 shows a frame construction of a conventional modulated output signal.
Figure 2:
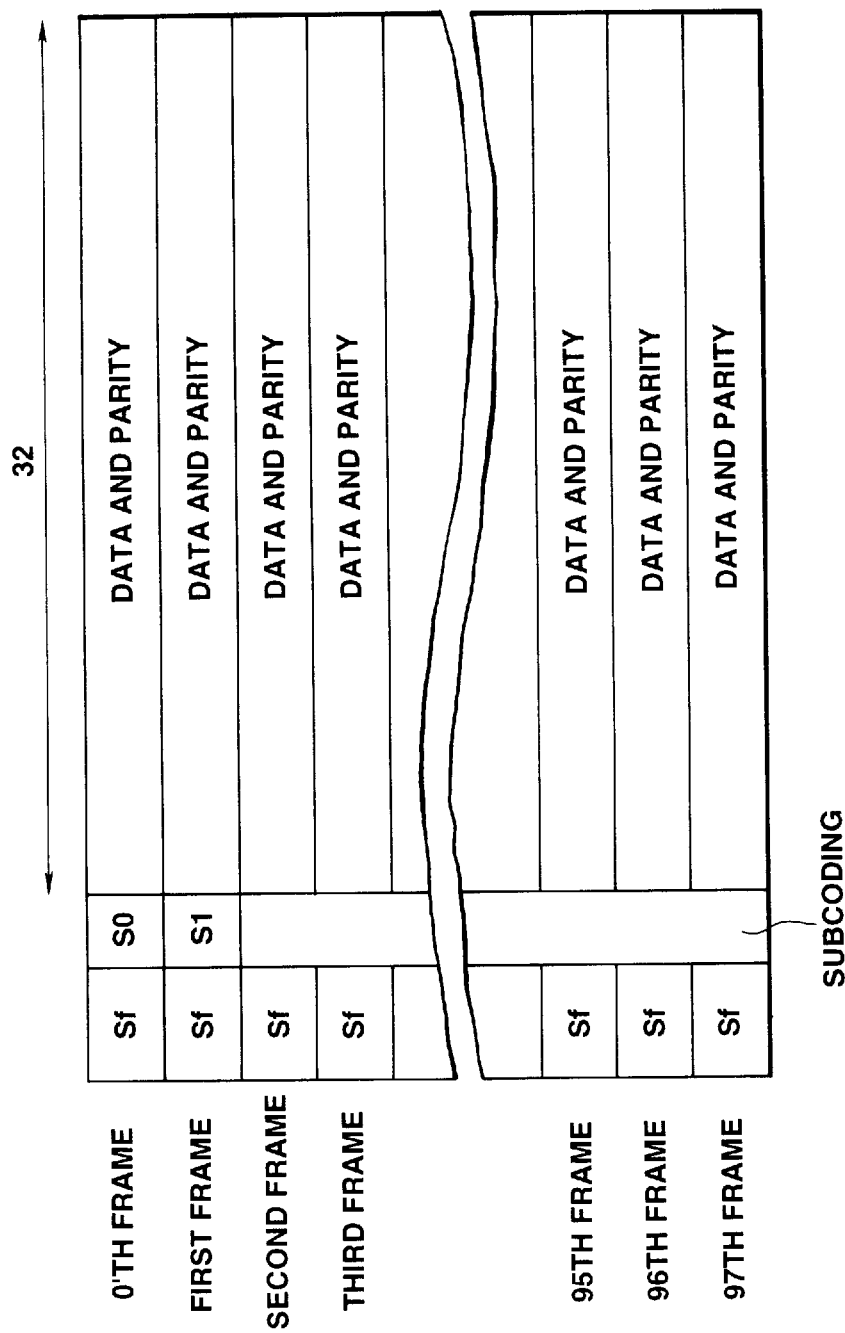
FIG. 2 shows a sub-coding frame structure of a conventional modulated output signal.
Figure 3:
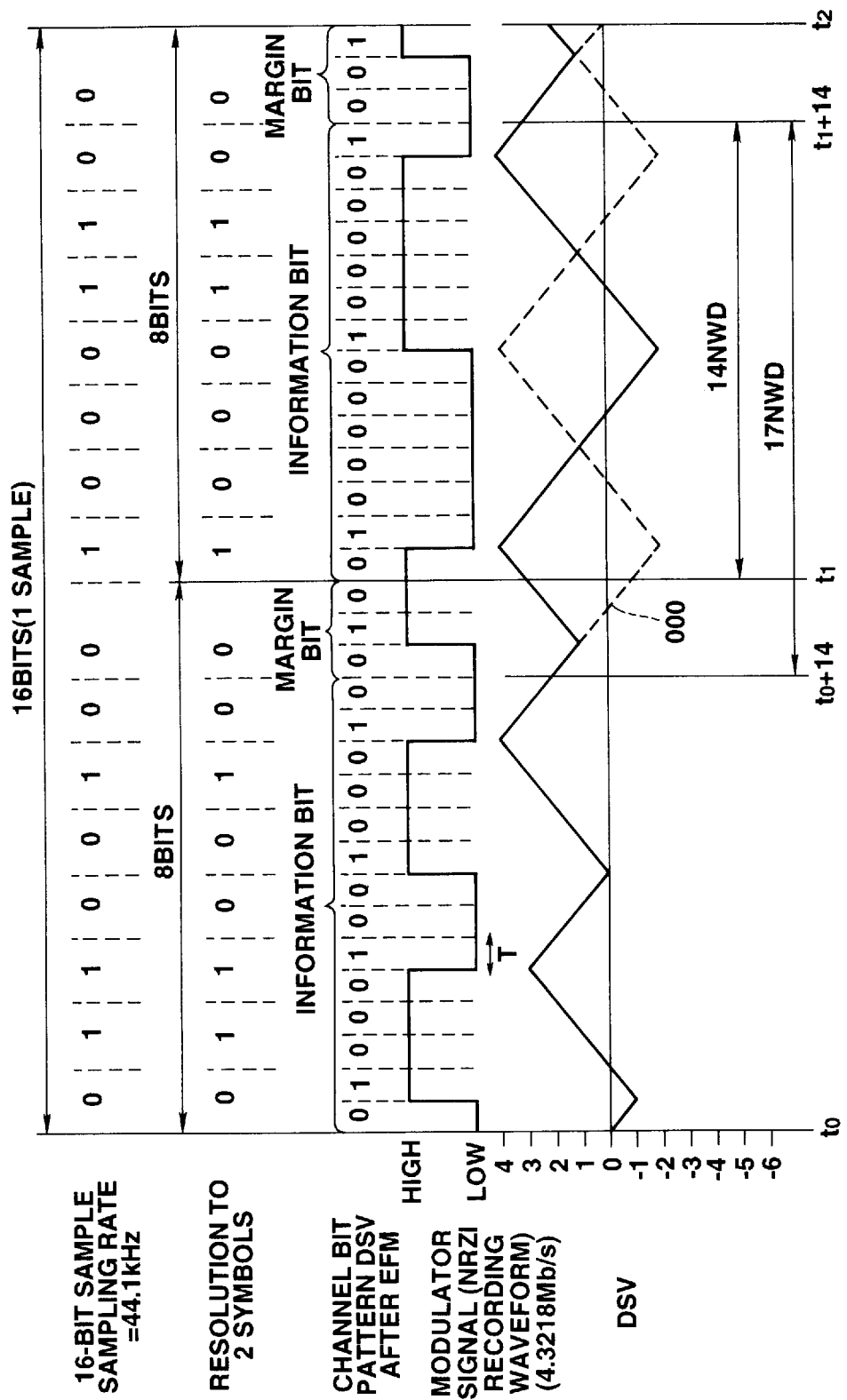
FIG. 3 shows conventional sample values and the EFM modulated waveform.

Preferred embodiments of the signal modulating method, the signal modulating apparatus, the signal demodulating method and the signal demodulating apparatus will now be described with reference to the drawings.

The signal modulating method and the signal modulating apparatus according to the present invention are effected on the assumption of converting an input M-bit based data string into an N-bit based code string, M and N being integers in a relation of M<N, and connecting the N-bit code to the next N-bit code. The conversion table for converting the M-bit based data string into the above-mentioned N-bit based code string is partially duplexed. The duplexed portions are configured so that the variants of the digital sum variation (digital sum value) of the codes of each of two mutually associated code sets are opposite in sign and close to each other in the absolute value.

FIG. 4 shows an example of the conversion table.

The conversion table is made up of a plurality of, e.g., four different sorts of unit tables $T_1$, $T_2$, $T_3$ and $T_4$, each unit table having a duplexed portion, as shown in FIG. 4. That is, if a table of sets of codes (channel bit patterns) for the totality of input signal values for a unit table is denoted as Ta, part of it is duplexed to form a table Tb. With the illustrative example of FIG. 4, 88 codes with input signal values of from 0 to 87 are duplexed. In the present specification, the table Ta and the table Tb are termed a front side table and a back side table, respectively.

Thus, with the illustrative example of FIG. 4, the conversion table is constituted by four sorts of tables $T_{1a}$, $T_{2a}$, $T_{3a}$, $T_{4a}$ for 256 16-bit codes or 256 16-channel bit patterns, associated with 8-bit input signal values of from 0 to 255, constituting the front side table, and four tables $T_{1b}$, $T_{2b}$, $T_{3b}$, $T_{4b}$, which are duplexed for 88 16-channel bit patterns of the tables $T_{1a}$, $T_{2a}$, $T_{3a}$, $T_{4a}$ having the input signal values of from 0 to 87, constituting the back side table. In the present embodiment, the duplexed portions of the conversion table, that is the 16-bit codes for the input signal values of from 0 to 87 of the tables $T_{1a}$, $T_{2a}$, $T_{3a}$, $T_{4a}$ and the 16-bit codes for the input signal values of from 0 to 87 of the tables $T_{1b}$, $T_{2b}$, $T_{3b}$, $T_{4b}$, are configured so that the variants of the digital sum value or variation of the associated code sets are opposite in polarity and close in magnitude to each other.

An embodiment of the signal modulating method employing the conversion table of FIG. 4 is explained.

With the present embodiment, shown in FIG. 4, the input 8-bit signal (data) is converted to a 16-bit code. In the conventional EFM system, the input 8-bit signal is converted into a 14-bit information bit pattern which is connected to a neighboring 14-information bit pattern via 3-bit merging bits. In the present system, the 8-bit input signal is directly converted into a 16-bit code without employing the merging bits. The present modulation system is referred to hereinafter as a 8–16 modulation system. The 8–16 modulation also satisfies the condition for EFM that the number of "0"s between "1" and "1" should be not less than 2 and not more than 10, that is the 3T~11T rule.

In the EFM, only one table is provided for converting the input 8-bit signal into a 14-bit code. With the 8–16 modulation system, plural sorts of tables are provided for converting the input 8-bit signal into a 16-bit code. In the embodiment shown in FIG. 4, four sorts of unit tables $T_1$, $T_2$, $T_3$ and $T_4$ are employed.

The "state values" employed in the classification of the unit tables is explained.

The state values play the part of indices for judging which of the conversion tables is to be employed when converting the input 8-bit signal (data) into the 16-bit code. Thus the kinds of the state values is equal to that of the different sorts of the unit tables of the conversion table. That is, in the present embodiment, there are four kinds of state values [1] to [4] in association with the four sorts of the unit tables $T_1$, $T_2$, $T_3$ and $T_4$.

The state values undergo transition each time a 8-bit symbol is converted into a 16-bit code. If the 16-bit code ends with "1" or "10", the state value undergoes transition to [1]. If the 16-bit code ends with not less than 2 and not more than 5 consecutive "0"s, the state value undergoes transition to [2] or [3]. If the 16-bit code ends with not less than 6 and not more than 9 consecutive "0"s, the state value undergoes transition to [4]. When a code undergoing transition to the state value "2" and a code undergoing to the state value "3" can be handled as perfectly different codes, whether the state value is [2] or [3] may be arbitrarily determined in producing the table.

The conversion table for converting the input 8-bit signal into the 16-bit code has the following characteristics.

The unit table $T_1$ employed when the state value is [1] is made up of 16-bit codes beginning with at least two "0"s in order to meet the condition that the number of "0"s between "1" and "1" should be not less than 2 and not more than 10 (3T~11T rule). The reason is that the 16-bit code modulated before transition of the state value to [1] ends with "1" or "10".

For the same reason, the unit tables $T_2$ or $T_3$, employed for the state values of [2] or [3], respectively, are made up of 16-bit codes beginning with 0 to 5 consecutive "0"s. It is noted that the unit table $T_2$ employed for the state value equal to [2] is made up of codes having both the first bit and the 13th bit (that is, the fourth bit from LSB) equal to "0", with the MSB being the first bit, while the unit table $T_3$ employed for the state value equal to [3] is made up of codes having one or both of the first bit and the 13th bit (the fourth bit from LSB) equal to "1", with the MSB again being the first bit.

The unit table $T_4$ employed when the state value is [4] is made up of 16-bit codes beginning with "1" or with "01".

There exist 16-bit codes which can be employed in common for the two different state values. For example, a 16-bit code beginning with three consecutive "0"s and having the first and the 13th bits equal to "0" may be employed both with the state value equal to [1] and with the state value equal to [2]. In order to prohibit possible confusion during decoding, the table needs to be configured so that the codes of different state values are associated with the same input 8-bit signal value (data).

On the other hand, the 16-bit code of the type in which the state value subsequently undergoes transition to [2] or [3] can be associated with two totally different sorts of the input 8-bit signals. Although the 16-bit code cannot be uniquely decoded by themselves, they can be correctly decoded by necessarily setting the next occurring state value to [2] or [3]. This method will be explained subsequently.

There is provided another table for indicating for respective codes of the unit tables, to which of [1] to [4] the next state values transfer when the input 8-bit signals are converted to the codes. If the 16-bit codes end with not less than 2 and not more than 5 consecutive "0"s, it is not possible to determine whether the state values next transfer to [2] or [3] by the code features themselves. However, the next state values can be uniquely determined by having reference to this table. Meanwhile, the state value is necessarily [1] following the synchronization pattern.

In the example of FIG. 4, the next state value is indicated by S for constituting the table consisting of the state values S indicating the transition direction.

Using the above tables, a modulator modulates 8-bit input symbols into 16-bit codes. The current state values are stored in the internal memory and the table to be referred to is identified from the state values. The 8-bit input signals are converted by the table by way of effecting the modulation. Simultaneously, the next state values are found from the table and held on memory so that the table to be referred to during the next conversion will be identified. The practical hardware configuration will be explained subsequently.

The digital sum variation or digital sum value (DSV) is controlled in the following manner.

It is checked for each state value how many 16-bit codes there exist which satisfy the run-length limitations (3T~11T rule) and can be used satisfactorily. For inhibiting occurrence of two repetitive patterns of 11T which are the same as the frame synchronization pattern, such 16-bit code in which ten "0"s are arrayed and followed by "1" followed in turn by five "0"s are pre-eliminated. The reason is that, if the code is connected to a 16-bit code pattern beginning with five consecutive "0"s, the two repetitive patterns of 11T are produced. If, after conversion to a 16-bit code, the state value undergoes transition to [2] or [3], the code may be used in two ways, so that these codes are counted twice.

The results of calculations indicate that 344 16-bit codes can be used with the state value of [1], 345 16-bit codes that can be used with the state value of [2], 344 16-bit codes can be used with the state value of [3] and 411 16-bit codes can be used with the state value of [4]. Since the input signal is a 8-bit signal, 256 codes suffice, so that there are at least 88 superfluous codes for the respective state values. These 88 superfluous codes are used for DSV control purposes. That is, using these superfluous codes, a table with the number of 88 entries is separately provided as a back side table. This back side table is provided in the present embodiment for the input 8-bit signals of from "0" to "87".

For achieving efficient DSV control with the present DSV control system, the front side and back side tables are constituted under the following principle.

There exist 16-bit codes that can employ two different state values in common as described above. Since the table needs to be formulated so that the same input 8-bit signal values (data) are associated with these codes at all times, the table formulating methods in this case are complicated because of these limitations. Since it is intended herein to indicate the method of formulating the table with a view to efficient DSV control, the following description is made on the assumption that the respective state values are taken independently and the 16-bit codes that can be used for the respective state values may be freely allocated to respective values of the input 8-bit signals.

Figure 5:
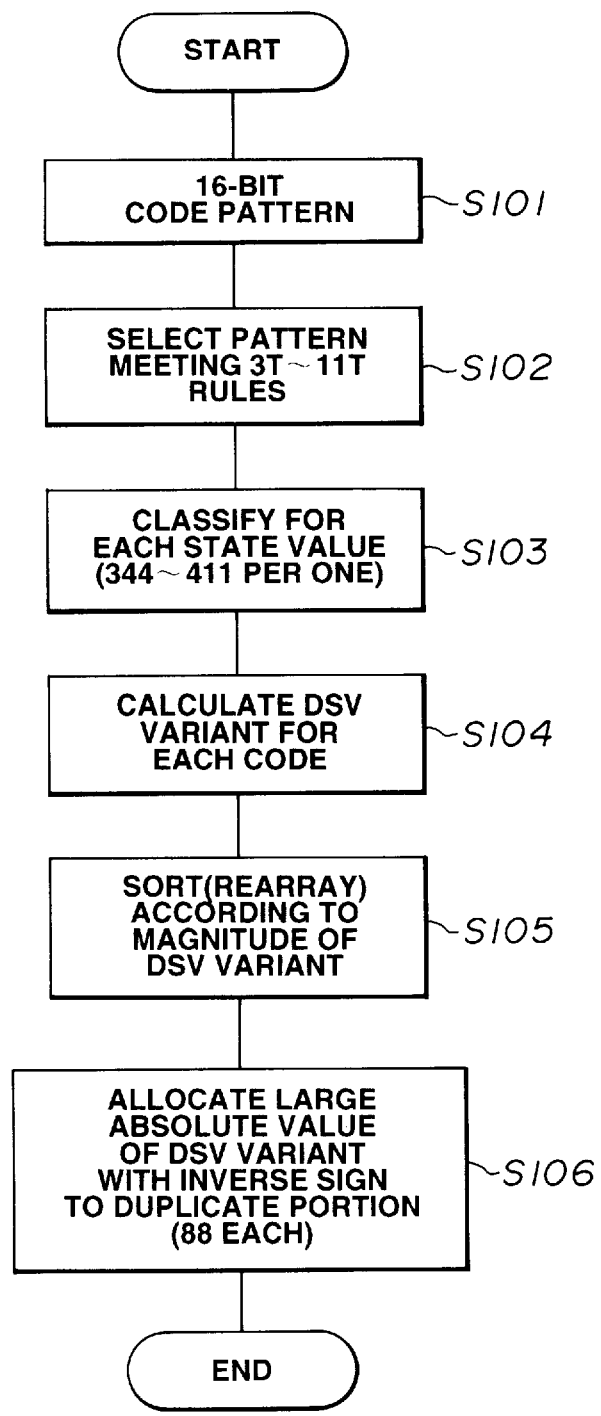
FIG. 5 is a flow chart showing an example of an algorithm constituting the conversion table.

The flow chart of FIG. 5 is intended for illustrating the method for formulating the above-mentioned conversion table, more specifically, the method for formulating an optional one of the four sorts of the unit tables of the conversion table.

Referring to FIG. 5, the totality of patterns of the 16-bit codes are found at step S101. At the next step S102, the bit patterns or codes which will satisfy the condition of the run-length limitation (3T~11T) are selected. At the next step S103, the codes are classified into codes which will follow the above-mentioned state-value-based conditions. The number of the 16-bit codes that may be employed for these state values is 344 to 411, as previously explained. For example, the number of the 16-bit codes that can be employed for the state value of [1] is 344.

At the next step S104, the amount of variation of the DSV for the level directly previous to each code (=CWLL) being low is calculated for each code for each of the state values. Since the code length is 16 bits, and the amount of variation of the DSV per code is −10 at the minimum and +10 at the maximum. If the state value is [1], as an example, the amount of DSV variation is −10 at the minimum and +6 at the maximum.

At the next step S105, the 344 16-bit codes having the state value equal to [1] are sequentially arrayed beginning from the code having the larger DSV variant on the positive side up to the code having the larger DSV variant on the negative side, by way of effecting the sorting.

At the next step S106, 88 16-bit codes are selected in order of decreasing amount of DSV variation on the positive side and sequentially allocated to "0" to "87" of the 8-bit input signal in the front-side table $T_{1a}$ in FIG. 6 for the state value of [1]. The larger the absolute value of the DSV variation of the selected 88 16-bit code, the smaller is the value of the input 8-bit signal to which the 16-bit code is allocated. On the other hand, 88 16-bit codes are selected in order of decreasing amount of DSV variation on the negative side and sequentially allocated to "0" to "87" of the 8-bit input signals in the back-side table $T_{1b}$ in FIG. 6. The larger the absolute value of the DSV variation of the selected 88 16-bit codes, the smaller is the value of the input 8-bit signal to which the 16-bit code is allocated. Finally, 168 16-bit codes are selected in order of small absolute value of the DSV variation and allocated to "88 to 255" of the 8-bit input signal in the front-side table $T_{1a}$ in FIG. 6.

If the state value is [1], the number of the 16-bit codes that can be employed is 344, so that the totality of codes that can be employed may be selected at this stage, as shown in FIG. 6.

FIGS. 7, 8 and 9 show examples of allocation of input signal values in the unit tables of the conversion table which are employed for the state values of [2], [3] and [4], respectively.

In FIGS. 6 to 9, the sequence of the 16-bit signals having the same amount of DSV variation is changed from that in the example of FIG. 4 during sorting. However, any of these tables may be employed without any inconvenience.

If the front side and back side tables Ta, Tb are formulated under the above-described principle, one of two 16-bit codes with opposite signs and with the larger absolute value of the DSV variant may be selected for the input 8-bit signal having a value between "0" and "87", thus enabling efficient DSV control. If the input 8-bit signal has a value between "88" and "255", the 16-bit codes are uniquely set such that DSV control cannot be performed. However, since these 16-bit codes are of the smaller absolute value of the DSV variant, it becomes possible to maintain the smaller absolute value of the cumulative DSV at all times.

The back side table Tb with 88 entries, defined as described above, has the same characteristics as those of the front side table Ta with 256 entries, except that the number of entries is small.

The DSV control is performed using both the front side table Ta and the back side table Tb. If the input 8-bit signal has a value between "0" and "87", which of the front side table Ta or the back side table Tb should be employed at the time of conversion of the input 8-bit signal into the 16-bit codes can be selected adaptively. Thus, with the present embodiment, the cumulative DSV is calculated at all times, the cumulative DSV in case the conversion is performed using the front side table Ta and the cumulative DSV in case the conversion is performed using the back side table Tb are calculated and that one of the tables which will reduce the absolute value of the cumulative DSV closer to zero is selected for effecting the conversion.

Figure 10:
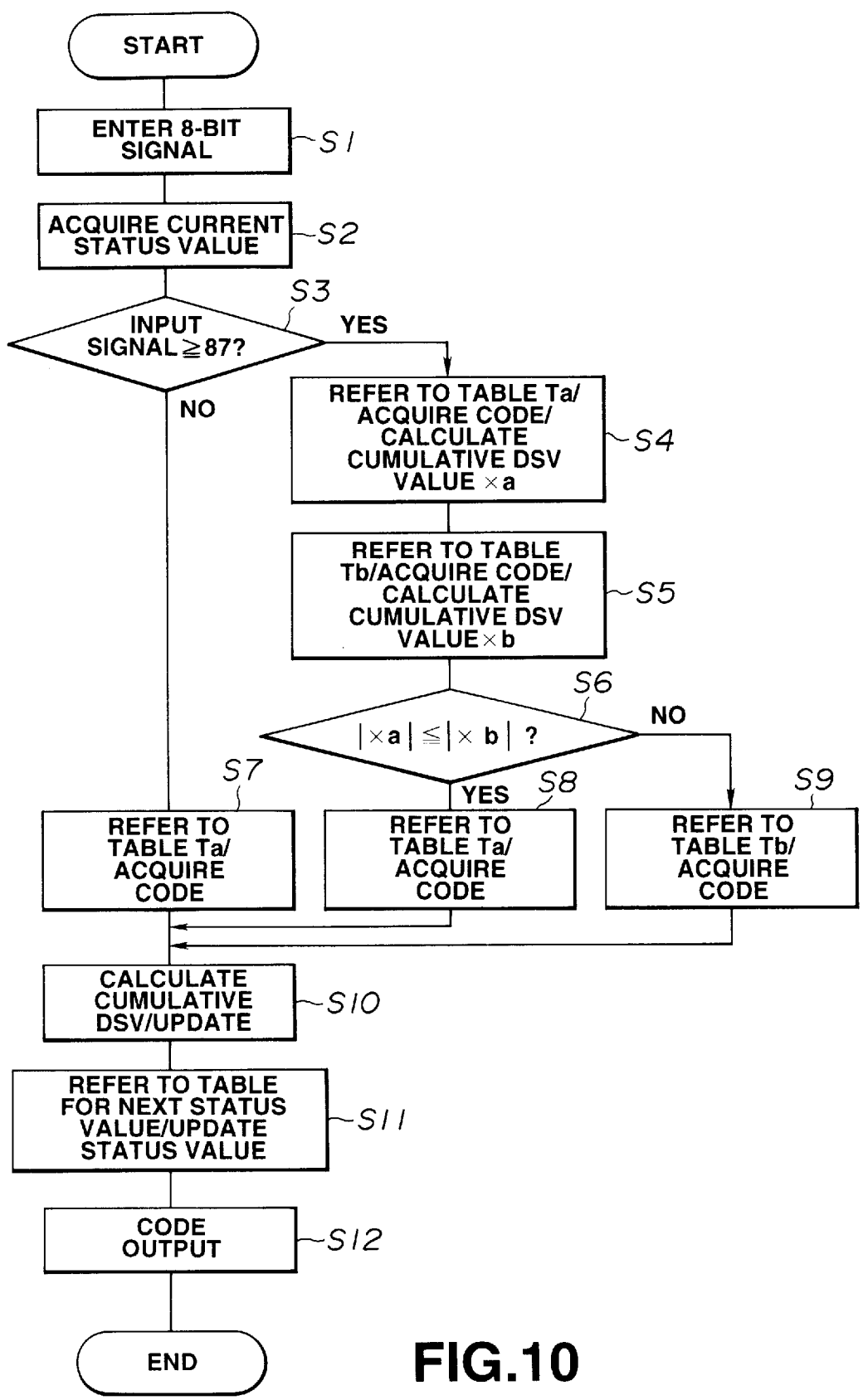
FIG. 10 is a flow chart showing an example of an algorithm of the signal modulating method embodying the present invention.

Referring to FIG. 10, the algorithm of the signal modulating system of the present embodiment employing the above-described conversion table is explained.

When a 8-bit signal (data) is entered at step S1, the current state value is acquired at step S2. It is then checked at step S3 whether or not the 8-bit input signal is not more than 87.

If the result of judgement at the step S3 is YES, that is if the input signal value is found to be 87 or less, the program transfers to step S4 in order to refer to the front side table Ta responsive to the current state value to acquire a 16-bit code corresponding to the input signal value and to calculate a cumulative DSV value xa. At the next step S5, the back side table Tb responsive to the current state value is referred to in order to acquire a 16-bit code corresponding to the input signal value and to calculate a cumulative DSV value xb. At the next step S6, the relative magnitudes of the cumulative DSV values xa and xb, that is whether or not $|xa| \leq |xb|$, are judged.

If the result of judgement at the step S3 is NO, that is if the input signal is found to be larger than 87, the program transfers to step S7 in order to refer to the front side table Ta responsive to the current state value to acquire a 16-bit code corresponding to the input signal value, before the program transfers to step S10. If the result of decision at step S6 is YES, that is if $|xa| \leq |xb|$, the front side table Ta is referred to in order to acquire a 16-bit code before the program proceeds to step S10. If the result of decision at step S6 is NO, that is if the absolute value of the cumulative DSV value xb of the back side table Tb is found to be smaller, the back side table Tb is referred to in order to acquire a 16-bit code before the program proceeds to step S10.

At step S10, the cumulative DSV is calculated and updated. At step S11, the table for the next state value, that is the table collectively showing the next state values S of FIG. 4, is referred to in order to update the state value. At the next step S12, the acquired 16-bit code is outputted.

Figure 11:
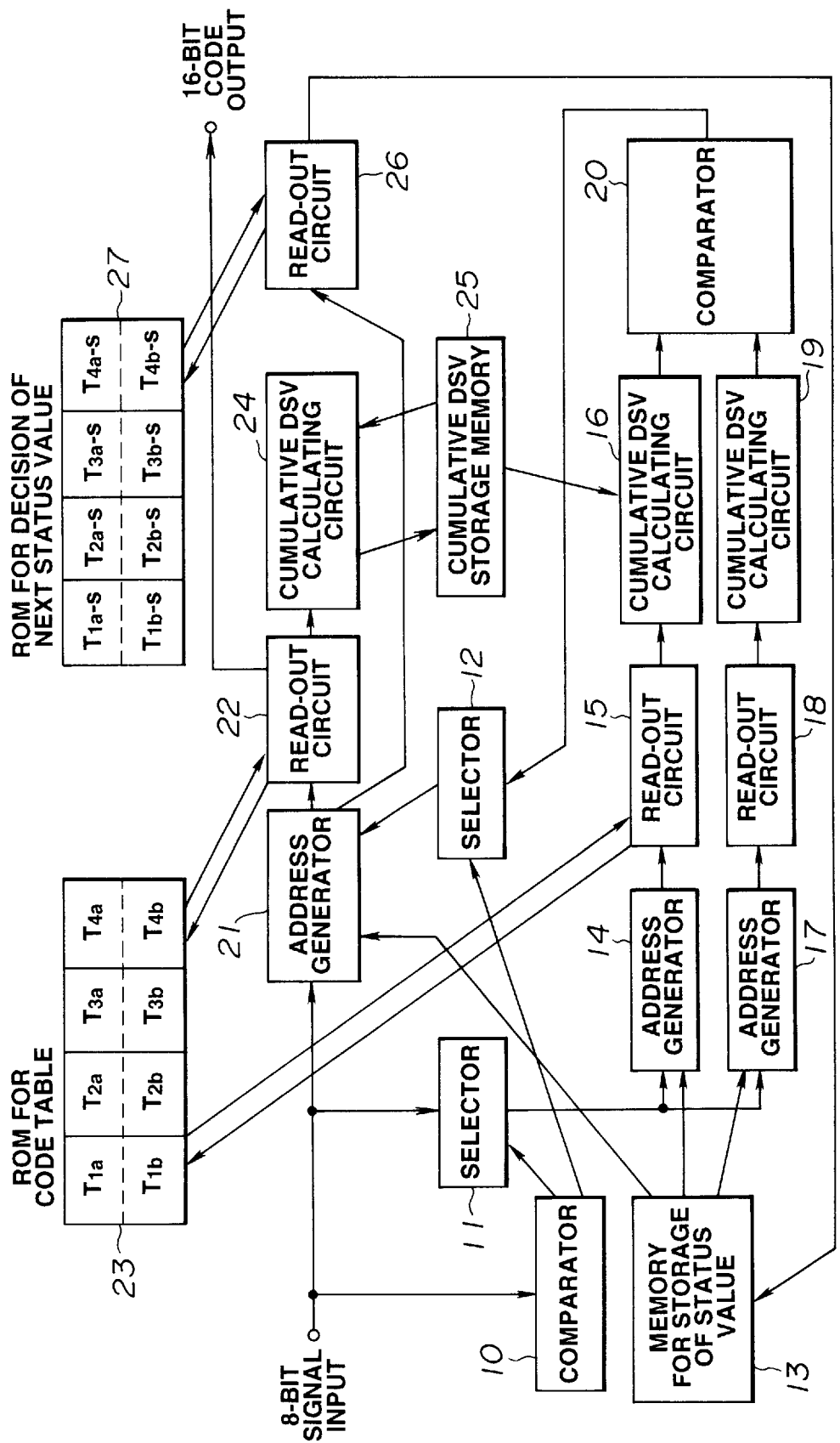
FIG. 11 is a flow chart showing an illustrative construction of a signal modulating apparatus embodying the present invention.

FIG. 11 shows, in a block circuit diagram, a typical construction of a signal modulating apparatus for realization of a signal modulating system embodying the present invention.

Referring to FIG. 11, a 8-bit input signal is entered to a comparator circuit 10 and an address generating circuit 21.

The comparator 10 compares the input 8-bit signal to a value "88". If the value of the 8-bit input is smaller than "88", the above-mentioned DSV control becomes feasible. Thus the comparator 10 instructs the selectors 11 and 12 to enter the DSV control mode.

If instructed by the comparator 10 to enter the DSV control mode, the selector 11 transmits the 8-bit input signal to address generators 14 and 17. If the 8-bit input signal is not less than "88", an instruction is issued from the comparator 10 to the effect that DSV control is not feasible and is not carried out. Thus the input 8-bit signal is not transmitted to the address generators.

A state value storage memory 13 is a memory for storing the current state value of from [1] to [4].

A cumulative DSV storage memory 25 is a memory for storing the current value of the cumulative DSV.

A conversion table ROM 23 for the 16-bit codes is a table ROM for storing 16-bit codes to which the 8-bit input signal values are to be converted. There are the four unit tables $T_1$, $T_2$, $T_3$ and $T_4$ associated with the respective state values. In addition, the 16-bit codes are duplexed as far as the input signal values of "0" to "87" are concerned, such that there exist the codes included in the front side table Ta and those included in the back side table Tb. Thus there are eight sorts of tables $T_{1a}$ to $T_{4b}$. Using these tables $T_{1a}$ to $T_{4b}$, it becomes possible to receive an address which is determined from three parameters, that is the 8-bit input signal, state value and a value indicating which of the front side table or the back side table is to be used, and to find the associated 16-bit code.

A next state value decision table ROM 27 is a table ROM for storing the next state value which prevails after conversion of the 8-bit input signal value to a 16-bit code. There are four tables for the respective state values, while the tables are duplexed as far as the input signal values of "0" to "87" are concerned, such that there is the back side table in addition to the front side table. That is, next state value decision tables $T_{1a-s}$, $T_{1b-s}$, $T_{2a-s}$, $T_{2b-s}$, $T_{3a-s}$, $T_{3b-s}$, $T_{4a-s}$ and $T_{4b-s}$ in association with the code tables $T_{1a}$, $T_{1b}$, $T_{2a}$, $T_{2b}$, $T_{3a}$, $T_{3b}$, $T_{4a}$ and $T_{4b}$, respectively. These tables $T_{1a-s}$ to $T_{4b-s}$ receive addresses determined from the three parameters, namely the 8-bit input signal values, the current state values and the value indicating which of the front side table or the back side table is to be employed, and finds out the associated next state value.

The address generating circuit 14 acquires the 8-bit input signal and the current state value supplied from the state value storage memory 13 in order to generate an address for producing from the 16-bit code table ROM 23 an address for acquiring the 16-bit code in case of employing a table Ta (hereinafter referred to as the first table) to transmit the address to a read-out circuit 15.

The read-out circuit 15 receives the address signal from the address generating circuit 14 and, using the address signal, acquires a 16-bit code from the 16-bit code table ROM 23. This code is transmitted to a cumulative DSV calculating circuit 16.

The cumulative DSV calculating circuit 16 calculates, from the 16-bit code received from the read-out circuit 15 and from the current cumulative DSV value received from the cumulative DSV storage memory 25 the value of the cumulative DSV resulting from employing the 16-bit code and transmits the calculated cumulative DSV value to a comparator circuit 20.

The address generating circuit 17 receives the 8-bit input signal and the current state value from the state value storage memory 13. The address generating circuit 17 also generates an address resulting from employing the second table from the 16-bit code table ROM 23 and routes the address to a read-out circuit 18.

The read-out circuit 18 receives the address signal from the address generating circuit 17 and, using the address signal, produces a 16-bit code from the 16-bit code table ROM 23. This code is routed to a cumulative DSV calculating circuit 19.

The cumulative DSV calculating circuit 19 calculates, from the 16-bit code received from the read-out circuit 18 and the value of the current DSV received from the cumulative DSV storage memory 25, the value of the cumulative DSV resulting from employing the 16-bit code, and transmits the calculated value to a comparator circuit 20.

The comparator 20 acquires, from the cumulative DSV calculating circuit 16 and the cumulative DSV calculating circuit 19, the value of the cumulative DSV in case of effecting the conversion using the first table and the value of the cumulative DSV in case of effecting the conversion using the second table and compares the corresponding absolute values to each other. Which of the tables gives the smaller absolute value of the cumulative DSV is determined and a signal indicating which table is to be employed is transmitted to the selector 12.

If instructed by the comparator 10 to enter the DSV control mode, the selector 12 routes a signal indicating which of the first and second tables is to be employed to the address generator 21. If instructed by the comparator 10 not to effect the DSV control, the selector 12 issues a signal to the address generator 21 for instructing the address generator 21 to use the first table in any case.

Using the value of the 8-bit input signal, the current state value received from the state value storing memory 13 and the signal from the selector 12 indicating as to which of the first or second tables is to be employed, the address generator 21 generates an address for acquiring the 16-bit code from the 16-bit code table ROM 23 and an address for acquiring the next state value from the next state value decision table ROM, and transmits the addresses to read-out circuit 22 and 26.

The read-out circuit 22 receives an address signal from the address generator 21 and, using the address signal, acquires the 16-bit code from the 16-bit code table ROM 23. This code is the 16-bit code output which is issued from the present modulator. The read-out circuit 22 also transmits the 16-bit code to a cumulative DSV calculating circuit 24.

The cumulative DSV calculating circuit 24 calculates, for the 16-bit code received from the read-out circuit 22 and the cumulative DSV received from the cumulative DSV storage memory 25, the value of the cumulative DSV which will prevail after using the 16-bit code, and updates the contents of the cumulative DSV storage memory 25 with the calculated value.

The read-out circuit 26 receives the address signal from the address generating circuit 21 and, using the address signal, acquires the next state value from the next state value decision table ROM 27. The read-out circuit 26 outputs the next state value to the state value storage memory 13 for updating its storage contents.

Figure 12:
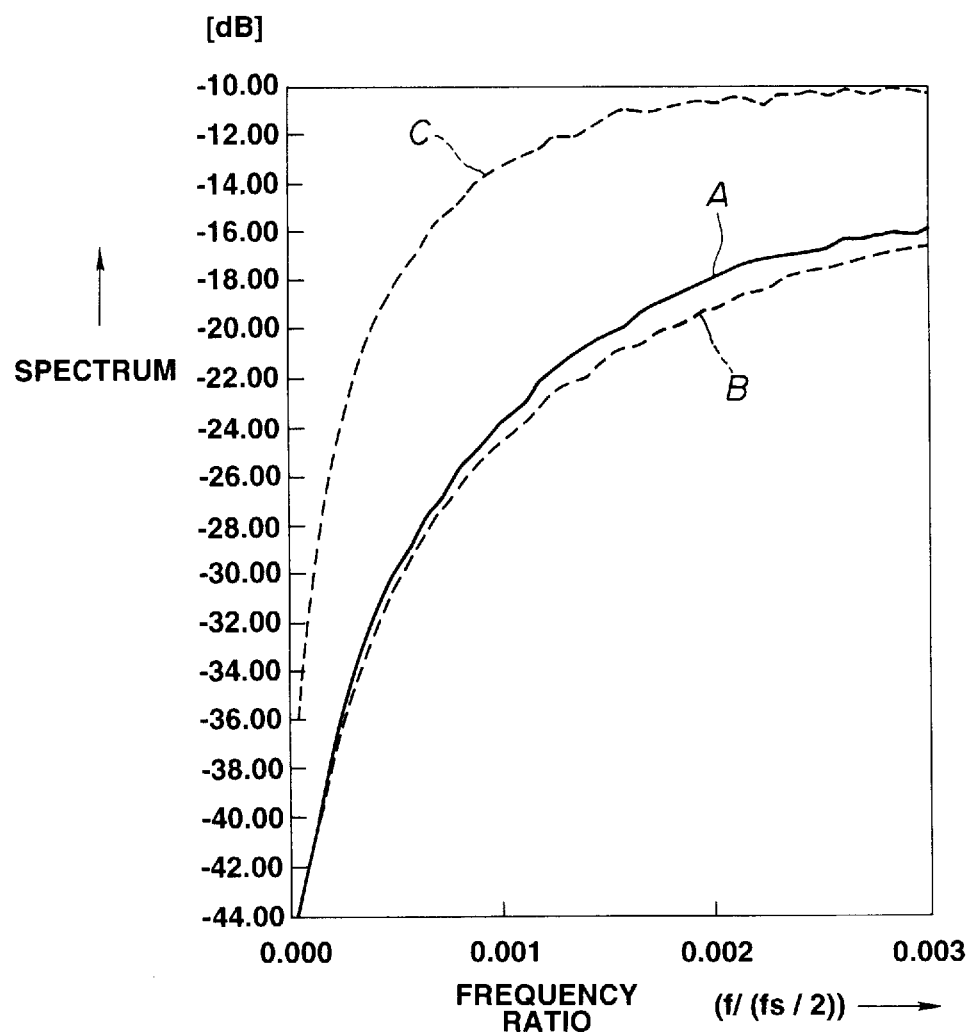
FIG. 12 is a graph showing how low-frequency components in the modulated signal may be decreased in the embodiment of the present invention as contrasted to the conventional system.

In FIG. 12, a curve A shows low-frequency components, as found by Fourier transform, of a recording waveform produced on modulating input-8-bit sample signals using the above-described signal modulating method and apparatus of the present invention.

On the other hand, a curve B in FIG. 12 shows low-frequency components of a recording waveform produced on modulating the same sample signals using a conventional EFM system and Fourier transforming the generated recording waveform, while a curve C in FIG. 12 shows low-frequency components of a recording waveform produced on modulating the same sample signals using a system corresponding to the conventional EFM system having two merging bits and Fourier transforming the generated recording waveform.

It is seen from the curves A, B and C of FIG. 12 that, with the present embodiment, the low-frequency components may be lowered to a level substantially equal to that achieved with the conventional EFM system, despite the fact that the modulation efficiency is equivalent to that of the conventional EFM system with the two merging bits, that is equal to 17/16 times that of the conventional EFM system.

The method of receiving the signal modulated with the modulating system of the present invention and demodulating the received signals to original 8-bit signal will now be explained.

With the conventional EFM system in which the 14-bit information bits are associated with the 8-bit input signal in a full one-to-one relationship, back conversion from the 14-bit information bits to the 8-bit signals can be achieved without any inconvenience.

With the embodiment of the present invention, there are occasions wherein the same 16-bit signals are allocated to different 8-bit input signals, so that the demodulator cannot effect the back conversion on simply receiving the 16-bit codes. Thus, if the demodulator of the present embodiment cannot effect back conversion on reception of a 16-bit code, it receives another succeeding symbol, that is another succeeding 16-bit code, in order to effect back conversion based upon the two symbols. The algorithm of the demodulating system of the present embodiment is shown in FIG. 13.

Figure 13:
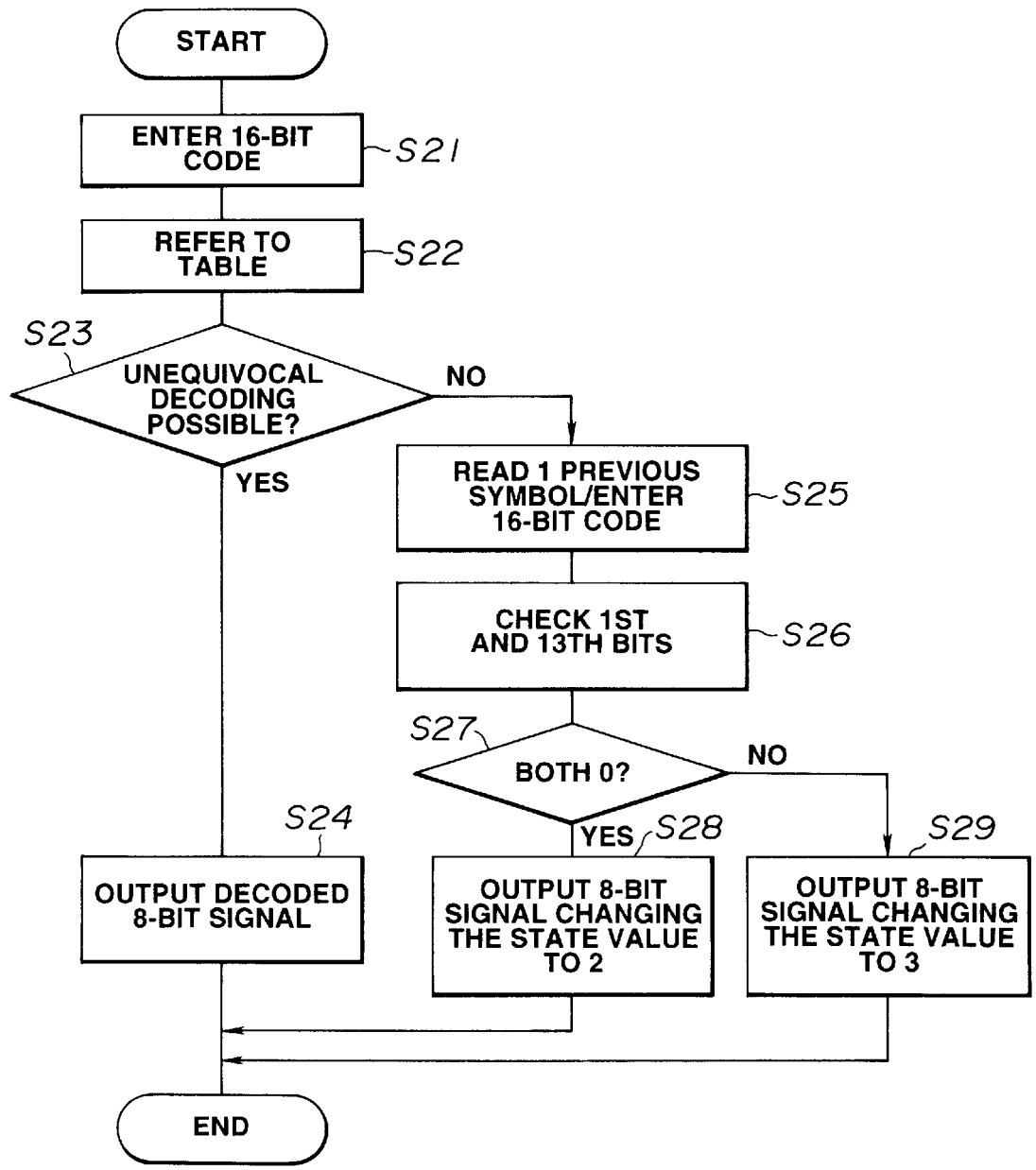
FIG. 13 is a flow chart showing an example of the algorithm of the signal modulating method as an embodiment of the present invention.

The sum of the demodulation algorithm shown in FIG. 13 is now explained.

The 16-bit code which can be allocated in common to two totally different values of the input 8-bit signals is necessarily restricted to the code in which the state value is changed next time to [2] or [3], as previously explained. In addition, if the state value to which one of such 16-bit codes transfers next is [2], the state value to which the other of the 16-bit codes transfers next is necessarily [3]. The table employed for the state value of [2] is made up of codes each of which has the first bit and the 13th bit equal to 0, with the MSB being the first bit, while the table employed for the state value of [3] is made up of codes each of which has one or both of the first bit and the 13th bit equal to 1, with the MSB being the first bit.

From these conditions, if the state value of the 16-bit code about to be back-converted transfers to [2], the succeeding 16-bit code has both the first bit and the 13th bit equal to 0, whereas, if the state value of the 16-bit code about to be back-converted transfers to [3], the succeeding 16-bit code has one or both the first bit and the 13th bit equal to 1. Thus, if the demodulator on reception of a 16-bit code is unable to effect the back-conversion, it receives another succeeding symbol (16-bit code) at step S25 of FIG. 13 to check the first and the 13th bits at step S26. Thus it is checked at step S27 if both of these bits are "0". If the result of judgment at step S27 is YES, that is if both of the bits are "0", the 16-bit code about to be back-converted is the code the state value of which transfers next to [2]. If the result of judgment at step S27 is NO, that is if one or both of the bits are "1", the 16-bit code about to be back-converted is the code the state value of which transfers next to [3]. This enables back-conversion to be effected uniquely.

Taking an illustrative example, this operation is explained by referring to the conversion table of FIG. 4.

In the case of the front side table $T_{1a}$ of the unit table $T_1$ of the conversion table of FIG. 4, with the state value equal to 1, the 16-bit codes for 8-bit input signals "5" and "6" are both "0010000000100100". Thus the demodulator on reception of the code "0010000000100100" cannot effect the back-conversion. In such case, the demodulator reads another succeeding symbol. If the succeeding code thus read is "0010000000001001", for example, this code is a code which has been converted for the state value [3], because the 13th bit of the code is "1". If the current code is the same code, herein "0010000000100100", the state value next transfers to [2] or to [3] if the input signal value is "5" or "6", respectively, the demodulator can effect correct decoding, that is it can judge the input signal to be such signal the state value of which transfers next time to [3], that is "6".

In the flow chart of FIG. 13, the 16-bit code is entered at step S21. Reference is had to the back-conversion table at step S22. It is judged at step S23 whether decoding can be achieved uniquely. If so, the program may naturally proceed to step S24 to output the decoded 8-bit signal.

Figure 14:
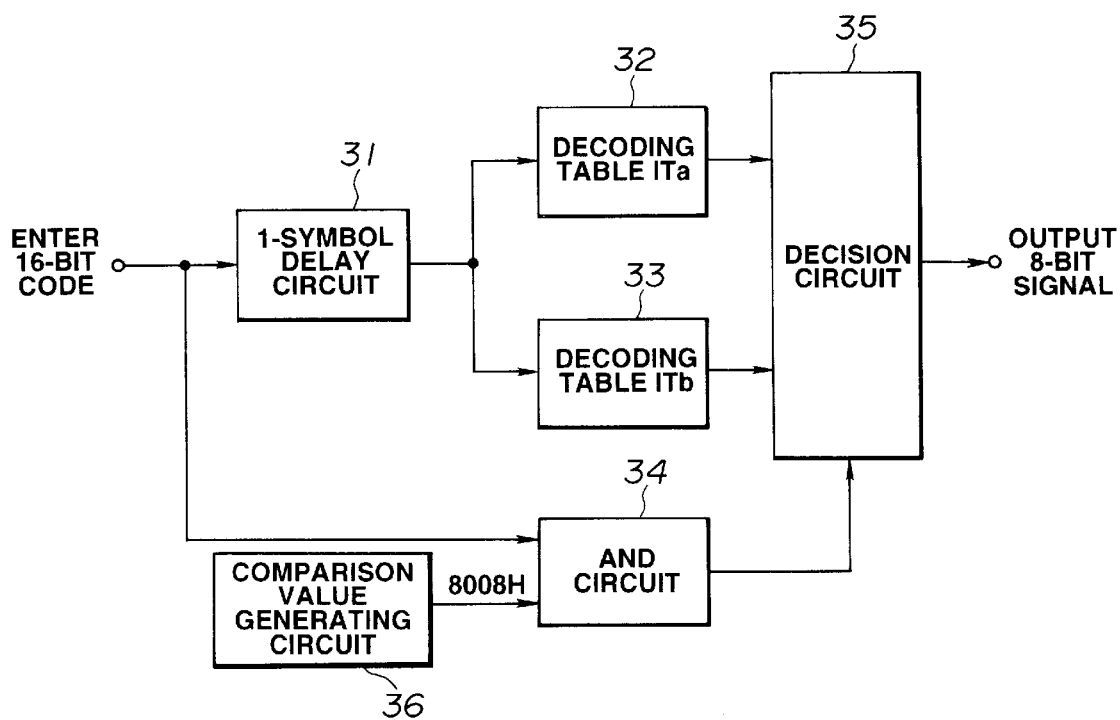
FIG. 14 is a block diagram showing an illustrative construction of a signal demodulating apparatus embodying the present invention.

FIG. 14 shows, in a block diagram, an illustrative construction of a signal demodulator embodying the present invention.

In FIG. 14, a 16-bit input code is routed to a 1-symbol delay circuit 31 and an AND gate 34.

The 1-symbol delay circuit 321 delay the input 16-bit code by one symbol. The 16-bit code, thus delayed by one symbol, is routed to a decoding table ROM 32 having a first table for decoding ITa therein and to a decoding table ROM 33 having a second table for decoding ITb therein.

The decoding first table ROM 32, having the first table for decoding ITa therein, receives the 16-bit code to effect back-conversion to output a 8-bit signal. If the code is the 16-bit code of the type which by itself does not permit back-conversion uniquely, the demodulator after outputting the 16-bit code outputs a 8-bit signal the state value of which transfers to [2]. The 8-bit output signal value is routed to a judgement circuit 35.

Similarly to the decoding first table ROM 32, the decoding second table ROM 33, having the second table for decoding ITb therein, receives the 16-bit code and effects back-conversion to output a 8-bit signal. If the 16-bit input code is such code as permits monistical back-conversion, it outputs nothing or outputs special data. If the 16-bit code is such a code which by itself does not permit monistical back-conversion, the modulator after outputting the code outputs a 8-bit signal value the state value of which transfers to [3]. The 8-bit signal, thus outputted by the modulator, is routed to the judgement circuit 35.

The AND circuit 34 takes AND of the input 16-bit code and a 16-bit code "1000 0000 0000 1000" from a comparison value generating circuit 36, which in hexadecimal notation is "8008", in order to check the first and 13th bits of the input 16-bit code, and outputs "0" and "1" if the bits of the 16-bit AND outputs are all "0" and otherwise, respectively. Since "8008" is such a code in which only the first bit and the 13th bit are "1" and the remaining bits are "0", with the MSB being the first bit, the output of the AND gate 134 is "0" or "1" if both the first bit and the 13th bit are "0" or if one or both of the first bit and the 13th bits are "1", respectively.

The judgement circuit 35 receives the signal from the AND circuit 34 and the 8-bit signal values supplied from the decoding first table ROM 32 and the decoding second table ROM 33. First, if no 8-bit signal is routed or special data is routed from the decoding second table ROM 33, it indicates that the 16-bit input code has been decoded uniquely to the 8-bit signal, so that the judgement circuit 35 directly outputs the 8-bit signal value routed from the decoding first table ROM 32 as an output signal. If the 8-bit signal value is supplied from the decoding second table ROM 33, it indicates that the input 16-bit code has not been able to be decoded uniquely to the 8-bit signal value. Since the data fed from the decoding first table ROM 32 and the decoding second table ROM 33 have been passed through the on-symbol delay circuit 31, these signals are codes pre-read by one symbol. Thus, if the 16-bit code entering the AND gate 34 is the code converted for the state value of [2], that is if the output signal of the AND gate 34 is "0", the judgement circuit 35 outputs the 8-bit signal, received from the decoding first table ROM 32, as an output signal. On the other hand, if the 16-bit code entering the AND gate 34 is the code converted for the state value of [3], that is if the output signal of the AND gate 34 is "1", the judgement circuit 35 outputs the 8-bit signal, received from the decoding second table ROM 33, as an output signal.

The above-described embodiment of the present invention is preferably applied above all to modulation or demodulation in recording digital speech, video or data on a high-density optical disc. The following is a typical signal format in the high-density optical disc:

| | |
|---|---|
| modulation system | a sort of 8–16 conversion |
| channel bit rate | 24.43 Mbps |
| error correction system | CIRC |
| data transmission rate | 12.216 Mbps |

The present invention is not limited to the above-described embodiments. For example, the number of bits N of the input signal or the number of channel bits M of the converted output signal is not limited to N=8 or M=16, but may be set to desired arbitrary values.

INDUSTRIAL APPLICABILITY

With the present invention, as described above, since the duplexed portions of the conversion table are designed so that the codes of each of two associated code sets are such codes in which the DSV variants are opposite in sign and approximate to each other in absolute value, the low-frequency components of the modulated signal can be suppressed satisfactorily.

Also, with the present invention, the conversion table is constituted by the first and second sub-tables including plural code groups, and the code group to be used in the next conversion is switched by a code immediately before, so that each N-bit code can be connected without using margin bits.

In addition, with the present invention, the conversion table is constituted by two kinds of sub-tables giving opposite effects of positive and negative effects to the cumulative DSV, and modulation is carried out with the two sub-tables switched adaptively, so that low frequency components of the modulated signals may be restricted sufficiently.

In contrast to the 8–14 conversion, that is, EFM, customarily employed in Compact Discs, 8-bit input signals can be converted into 16 channel bit codes without employing merging bits. That is, in contrast to the conventional method in which a 8 bit pattern is converted into a 14-bit information bit pattern and three merging bits, thus totalling at 17 bits, the data recording density may be raised by a factor of 17/16, while the low-frequency components are suppressed.

For raising the recording density, it may be contemplated to convert the 8-bit symbol into 14 information bits plus two merging bits, thus totalling at 16 bits. In contrast to this method, the low-frequency components of the modulated signals can be suppressed sufficiently because two sorts of conversion tables affording inverse operations, that is positive and negative operations, on the cumulative DSV, are provided, and modulation is carried out whilst these two sorts of tables are changed over appropriately.

In addition, the signals modulated in accordance with the present system may be decoded by pre-reading an additional symbol and performing decoding the signal in conjunction with the additional symbol.

We claim:

1. A signal modulating method for converting an M-bit based data string into an N-bit based code string, where M and N are integers having a relation of M<N, the method comprising:

receiving the M-bit based data string as a first data word of a plurality of data words;

translating the first data word into a first code word from a first table of a plurality of primary and secondary code word tables, wherein the secondary code word tables are associated with only a portion of the data words;

determining whether the plurality of secondary code word tables can be used for translating a second data word into a second code word based on a value of the second data word;

if the plurality of secondary code word tables can be used for translating the second data word, then determining whether the plurality of primary code word tables or the plurality of secondary code word tables is to be used for translating a second data word into a second code word based on a DSV value;

determining which one of the plurality of code word tables is to be used based on a previous data word; and wherein there is at least a general progression of DSV values for the code words in each of the plurality of primary tables from at least substantially a relative maximum DSV associated with a minimum data word value toward a relative minimum DSV associated with a maximum data word, and further wherein there is at least a general progression of DSV values for the code words in the secondary tables from at least substantially a relative minimum DSV toward relative maximum DSV and wherein the code words in the secondary tables are associated with a portion of the data words in a progression from at least substantially a minimum data word value toward a maximum value.

2. The signal modulating method as claimed in claim 1, wherein the step of determining which one of the plurality of code word tables is to be used for the second data word comprises identifying a state value associated with the first code word.

3. The signal modulating method as claimed in claim 2, further comprising a step of
selecting one of the primary or secondary tables which will result in a smaller cumulative digital sum variation.

4. The signal modulating method as claimed in claim 3, comprising a step of obtaining a code from the plurality of primary code word tables when it is judged that the second data word data is not less than a predetermined value.

5. The signal modulating method as claimed in claim 4, further comprising a step of updating a cumulative digital sum variation value.

6. The signal modulating method as claimed in claim 5, further comprising a step of identifying a next state value.

7. The signal modulating method as claimed in claim 3, wherein each of the code words in the primary and secondary code word tables satisfies modulation rules of having a minimum wavelength of 3T and a maximum wavelength of 11T, with T representing a cycle of one channel clock.

8. The signal modulating method as claimed in claim 7, wherein the plurality of primary and secondary code word tables is comprised of four groups of primary and secondary code word tables.

9. The signal modulating method as claimed in claim 8, wherein a first group of the four primary and secondary code word tables is comprised of code words starting with at least two "0s".

10. The signal modulating method as claimed in claim 8, wherein a second group of the four primary and secondary code word tables is comprised of code words starting with a maximum of five "0s", and a first bit from the most significant bit (MSB) of the code and a fourth bit from the least significant bit (LSB) of the code being "0".

11. The signal modulating method as claimed in claim 10 wherein a third group of the four primary and secondary code word tables is comprised of code words starting with a maximum of five "0s", and one or both of a first bit from the most significant bit (MSB) of the code word and a fourth bit from the least significant bit of the code word being "1".

12. The signal modulating method as claimed in claim 8, wherein a fourth group of the four primary and secondary code word tables is comprised of code words starting with "1" or "01".

13. The signal modulating method as claimed in claim 9, wherein the step of determining which one of the plurality of code word tables is to be used comprises a step of selecting from the first code group next if a current code word ends with "1" or "10".

14. The signal modulating method as claimed in claim 11, wherein the step of determining which one of the plurality of code word tables is to be used comprises a step of selecting from the second or third code group next if a current code ends with two to five "0s".

15. The signal modulating method as claimed in claim 12, wherein the step of determining which one of the plurality of code word tables is to be used comprises a step of selecting the fourth code group next if a current code ends with six to nine "0s".

16. The signal modulating method as claimed in claim 13, comprising a step of selecting a code word from the first group of the plurality of code word tables after receiving a sync pattern.

17. The signal modulating method as claimed in claim 8, wherein each of the plurality of code word tables has a portion to which a same code is allocated for different input data, the same code having different state values.

18. The signal modulating method as claimed in claim 8, wherein the plurality of code word tables have portions to which a same code is allocated for same input data, the allocated same code having the same state value.

19. A signal modulating apparatus for converting an M-bit data string into an N-bit code string comprising:
receiving means for receiving the M-bit based data string as an input signal value;
conversion means for converting the M-bit data into the N-bit code in accordance with a conversion table; and
output means for outputting the N-bit based code string as a modulation result;
wherein the conversion table comprises a plurality of primary and secondary code word tables, each of said primary and secondary code word tables arranged in groups of tables, said groups of primary and secondary tables each respectively containing binary values which all have a pattern of at least some binary digits associated with the respective group;
said primary code word tables containing code words in one-to-one correspondence with a plurality of available data words and arranged at least generally in a progression of DSV values from at least substantially a relative maximum DSV associated with a minimum data word toward a relative minimum DSV associated with a maximum data word;
said secondary code word tables containing code words which correspond only with a portion of the available data words and wherein code words from said secondary tables have DSV values which are arranged at least generally in a progression of DSV values from at least substantially a relative minimum DSV toward relative maximum DSV and wherein the code words in the secondary tables correspond with a portion of the data words from at least substantially a minimum data word value toward a maximum value.

20. The signal modulating apparatus as claimed in claim 19, further comprising a plurality of next state values in one-to-one correspondence with the code words, said state values identifying a next group of the plurality of code tables.

21. The signal modulating apparatus as claimed in claim 20, wherein the conversion means comprises:
judging means for judging whether or not the input data is data between first input data and second input data;
comparing means for comparing a cumulative digital sum variation calculated by a code obtained on the first sub-table with a cumulative digital sum variation calculated by a code obtained on the second sub-table, when it is judged that the input data is included between the first input data and the second input data; and
selecting means for selecting a code obtained on either one of the tables which will result in a smaller cumulative digital sum variation.

22. The signal modulating apparatus as claimed in claim 21, wherein the conversion means further comprises means for obtaining a code from the primary code word tables when it is judged that the input data is not between the first input data and the second input data.

23. The signal modulating apparatus as claimed in claim 22, further comprising means for updating the cumulative digital sum variation.

24. The signal modulating apparatus as claimed in claim 23, further comprising means for updating and holding the state value.

25. The signal modulating apparatus as claimed in claim 21, wherein the code words in each of the primary and secondary tables has a minimum wavelength of 3T and a maximum wavelength of 11T, with T representing a cycle of one channel clock.

26. The signal modulating apparatus as claimed in claim 25, wherein the plurality of primary and secondary code word tables is comprised of four groups of primary and secondary code word tables.

27. The signal modulating apparatus as claimed in claim 26, wherein a first code group is comprised of code words starting with at least two "0s".

28. The signal modulating apparatus as claimed in claim 26, wherein a second code group is comprised of code words starting with the maximum of five "0s", a first bit from the most significant bit (MSB) of the code and a fourth bit from the least significant bit (LSB) of the code being "0".

29. The signal modulating apparatus as claimed in claim 28, wherein a third code group is comprised of code words starting with a maximum of five "0s", one or both of a first bit from the most significant bit (MSB) of the code word and a fourth bit from the least significant bit (LSB) of the code being "1".

30. The signal modulating apparatus as claimed in claim 26, wherein a fourth code group is comprised of codes starting with "1" or "01".

31. The signal modulating apparatus as claimed in claim 27, wherein when a current code ends with "1" or "01", the state value becomes 1, with a next code being selected from the first code group.

32. The signal modulating apparatus as claimed in claim 29, wherein when a current code ends with two to five "0s", the state value becomes 2 or 3, with a next value being selected from the first code group.

33. The signal modulating apparatus as claimed in claim 30, wherein when a current code ends with six to nine "0s", the state value becomes 4, with a next code being selected from the fourth code group.

34. The signal modulating apparatus as claimed in claim 31, wherein a code word following a sync pattern is selected from the first code group.

35. The signal modulating apparatus as claimed in claim 25, wherein each of the plurality of primary and secondary code word tables has a portion to which a same code is allocated for different input data, the same code having different state values.

36. The signal modulating apparatus as claimed in claim 25, wherein the plurality of primary and secondary code word tables have portions to which the same code is allocated for the same input data, the allocated same code having the same state value.

37. A signal demodulating method for inversely converting an N-bit based code string to generate an M-bit based data string, where M and N are integers having a relation of M<N, the method comprising:

a first step of receiving an N-bit based input code string;

a second step of inversely converting the N-bit input code into M-bit data in accordance with an inverse conversion table; and a third step of outputting an M-bit based data string as a demodulation result, the inverse conversion table comprised of a plurality of primary and secondary code word tables, each of said primary and secondary code word tables arranged in groups of tables, said groups of primary and secondary tables each respectively containing binary values which all have a pattern of at least some binary digits associated with the respective group;

said primary code word tables containing code words in one-to-one correspondence with a plurality of available data words and arranged at least generally in a progression of DSV values from at least substantially a relative maximum DSV associated with a minimum data word toward a relative minimum DSV associated with a maximum data word;

said secondary code word tables containing code words which correspond only with a portion of the available data words and wherein code words from said secondary tables have DSV values which are arranged at least generally in a progression of DSV values from at least substantially a relative minimum DSV toward a relative maximum DSV and wherein said secondary code words correspond with a range of data words from at least substantially a minimum value toward a maximum value.

38. The signal demodulating method as claimed in claim 37, wherein the primary and secondary code word tables include portions to which different data words are associated with a same input code.

39. The signal demodulating method as claimed in claim 38, wherein the same input code for which the different data are associated with belongs to the first code group.

40. The signal demodulating method as claimed in claim 38, further comprises steps of:

judging whether the input code is uniquely decodable or not;

reading a code next to the input code currently being decoded and checking a state of the next code when it is judged that the input code is not uniquely decodable; and determining output data for the input code currently being decoded based on the state of the next input code.

41. The signal demodulating method as claimed in claim 40, wherein the input code has a minimum wavelength of 3T and a maximum wavelength of 11T, with T representing a cycle of one channel clock.

42. The signal demodulating method as claimed in claim 40, wherein the plurality of primary and secondary code word tables is comprised of four code groups.

43. The signal demodulating method as claimed in claim 42, wherein code words in the first code group start with at least two "0s".

44. The signal demodulating method as claimed in claim 42, wherein code words in the second code group start with a maximum of five "0s", a first bit from the most significant bit (MSB) of the code and a fourth bit from the least significant bit (LSB) of the code being "0".

45. The signal demodulating method as claimed in claim 44, wherein code words in the third code group start with a maximum of five "0s", and one or both of a first bit from the most significant bit (MSB) of the code word and a fourth bit from the least significant bit (LSB) of the code word being "1".

46. The signal demodulating method as claimed in claim 42, wherein code words in the fourth code group start with "1" or "01".

47. A signal demodulating apparatus for inversely converting an N-bit based code string to generate an M-bit based data string, where M and N are integers having a relation of M<N, the apparatus comprising:

receiving means for receiving the N-bit based input code string;

inverse conversion means for inversely converting the N-bit input code into M-bit data in accordance with an inverse conversion table; and output means for outputting an M-bit based data string as a demodulation result;

the inverse conversion table comprised of a plurality of primary and secondary code word tables, each of said primary and secondary code word tables arranged in groups of tables, said groups of primary and secondary tables each respectively containing binary values which all have a pattern of at least some binary digits associated with the respective group;

said primary code word tables containing code words in one-to-one correspondence with a plurality of available data words and arranged at least generally in a progression of DSV values from a relative maximum DSV associated with a minimum code word to relative minimum DSV corresponding to a maximum data word values;

said secondary code word tables containing code words which correspond only with a portion of the available data words and wherein code words from said secondary tables have DSV values which are arranged at least generally in a progression of DSV values from relative minimum toward relative maximum and wherein said code words correspond with the portion of respective data words from minimum value toward maximum value.

48. The signal demodulating apparatus as claimed in claim 47, wherein the primary and secondary tables include portions to which different data are associated with a same input code.

49. The signal demodulating apparatus as claimed in claim 48, wherein the same input code to which different data are associated belongs to a same code group.

50. The signal demodulating apparatus as claimed in claim 48, wherein the the inverse conversion means comprises:

means for judging whether the input code is uniquely decodable or not with reference to the inverse conversion table;

means for reading a code next to the input code currently being decoded and checking a state of the next code when it is judged that the input code is not uniquely decodable; and means for determining output data for the input code currently being decoded in accordance with the state of a next input code.

51. The signal demodulating apparatus as claimed in claim 50, wherein the input code has a minimum wavelength of 3T and a maximum wavelength of 11T, with T representing a cycle of one channel clock.

52. The signal demodulating apparatus as claimed in claim 50, wherein the plurality of primary and secondary code word tables is comprised of four groups code word tables.

53. The signal demodulating apparatus as claimed in claim 52, wherein codes words in the first code group start with at least two "0s".

54. The signal demodulating apparatus as claimed in claim 52, wherein code words in the second code group start with a maximum of five "0s", and a first bit from the most significant bit (MSB) of the code word and the fourth bit from the least significant bit (LSB) of the code being "0".

55. The signal demodulating apparatus as claimed in claim 54, wherein code words in the third code group start with a maximum of five "0s", and one or both of a first bit from the most significant bit (MSB) of the code and a fourth bit from the least significant bit (LSB) of the code being "1".

56. The signal demodulating apparatus as claimed in claim 52, wherein code words in the fourth code group start with "1" or "01".

57. A method for generating a conversion table to convert an M-bit based data string into an N-bit based code string comprising:

a step of selecting codes from all possible patterns of N-bit based codes having at least one pattern of binary values;

a step of classifying the selected codes into plural code groups in accordance with respective group pattern constraints;

a step of calculating variants of digital sum variations of the codes of the plural code groups;

a step of arranging the codes in tables at least generally in a progression from a code having a relative maximum digital sum variation toward a relative minimum digital sum variation;

a step of associating the arranged codes to the M-bit data such that a primary table has codes wherein those having a relative maximum digital sum variation are generally associated with respective data words in a corresponding progression from a minimum to a maximum numeric values; and a step forming a secondary table wherein the code words in the secondary table are arranged at least generally in a progression from a code having at least substantially a relative minimum DSV to a relative maximum DSV and wherein the code words in the secondary table are respectively associated with only a portion of all possible data words in a progression from minimum toward maximum.

58. The signal modulating method as claimed in claim 57, wherein the codes have a minimum wavelength of 3T and a maximum wavelength of 11T, with T being a cycle of one channel clock.

59. The signal modulating method as claimed in claim 57, wherein codes having smaller absolute variant of the digital sum variation are allocated to data having larger numeric values.

60. The signal modulating method as claimed in claim 57, wherein the the primary and secondary code word tables are comprised of four groups of code word tables.

61. The signal modulating method as claimed in claim 60, wherein code words in the first code group start with at least two "0s".

62. The signal modulating method as claimed in claim 60, wherein code words in the second code group start with a maximum of five "0s", and a first bit from the most significant bit (MSB) of the code and a fourth bit from the least significant bit (LSB) of the code being "0".

63. The signal modulating method as claimed in claim 60, wherein code words in the third code group start with a maximum of five "0s", and one or both of a first bit from the most significant bit (MSB) of the code and a fourth bit from the least significant bit (LSB) of the code being "1".

64. The signal modulating method as claimed in claim 60, wherein code words in the fourth code group start with "1" or "01".

65. The method of claim 1, wherein the relative maximum DSV is a positive DSV value.

66. The method of claim 1, wherein the relative maximum DSV is a negative DSV value.

67. The apparatus of claim 19, wherein the relative maximum DSV is a positive DSV value.

68. The apparatus of claim 19, wherein the relative maximum DSV is a negative DSV value.

69. The method of claim 37, wherein the relative maximum DSV is a positive DSV value.

70. The method of claim 37, wherein the relative maximum DSV is a negative DSV value.

71. The apparatus of claim 47, wherein the relative maximum DSV is a positive DSV value.

72. The apparatus of claim 47, wherein the relative maximum DSV is a negative DSV value.

73. The method of claim 57, wherein the relative maximum DSV is a positive DSV value.

74. The method of claim 57, wherein the relative maximum DSV is a negative DSV value.

75. The method of claim 1, wherein at least one of the plurality of tables has a strict progression of DSV values.

76. The method of claim 37, wherein at least one of the plurality of tables has a strict progression of DSV values.

77. The method of claim 19, wherein at least one of the plurality of tables has a strict progression of DSV values.

78. The method of claim 47, wherein at least one of the plurality of tables has a strict progression of DSV values.

79. The method of claim 57, wherein at least one of the plurality of tables has a strict progression of DSV values.

\* \* \* \* \*